(12) United States Patent
Sugitani

(10) Patent No.: US 6,566,872 B1
(45) Date of Patent: May 20, 2003

(54) MAGNETIC SENSOR DEVICE

(75) Inventor: Novuyosi Sugitani, Susono (JP)

(73) Assignee: Xenosensors, Inc., Fremont, CA (US)

( * ) Notice: Subject to any disclaimer, the term of this patent is extended or adjusted under 35 U.S.C. 154(b) by 0 days.

(21) Appl. No.: 10/029,870

(22) Filed: Dec. 31, 2001

(51) Int. Cl.[7] ............................................. G01R 33/02
(52) U.S. Cl. ...................................... 324/249; 324/260
(58) Field of Search ................................ 324/249, 244, 324/260, 259, 236, 252; 360/110, 125

(56) References Cited

U.S. PATENT DOCUMENTS 5,838,154 A  * 11/1998 Morikawa .................... 324/249
6,351,119 B1 *  2/2002 Kawase ........................ 324/249

* cited by examiner

*Primary Examiner*—Edward Lefkowitz
*Assistant Examiner*—Subhash Zaveri

(74) *Attorney, Agent, or Firm*—Armstrong, Westerman & Hattori, LLP

(57) ABSTRACT

A magnetic sensor device has a magnetic sensor having a magnetic material whose threshold frequency is changed by a magnetic field to be detected, and the device has the so-called electromagnetically-coupled current path which is affected by the magnetic material in order to electrically detect the threshold frequency of the magnetic material. The current path is connected to an oscillator circuit, which is set so that its oscillation frequency is changed by a change in the threshold frequency of the magnetic sensor. In the magnetic sensor device, the magnetic field to be detected causes a change in the oscillation frequency of the oscillator circuit, and the change in the frequency is extracted as a magnetic field detection signal. More specifically, a change in the threshold frequency of the magnetic material of the magnetic sensor caused by the magnetic field to be detected is extracted as a change in an output frequency of the oscillator circuit, and the change in the output frequency is used as the magnetic field detection signal.

12 Claims, 24 Drawing Sheets

Output characteristics of GMR

Correlation between applied external magnetic field and magnetic resonance frequency Correlation between complex magnetic permeability and impedance Correlation between complex magnetic permeability and impedance near resonance frequency Correlation between magnetic resonance frequency and complex magnetic permeability Correlation between applied magnetic field to be detected and magnetic resonance frequency Correlation between frequency and impedance Z Example of impedance change which occurs when high-pass filter is added Fig. 20
(A)
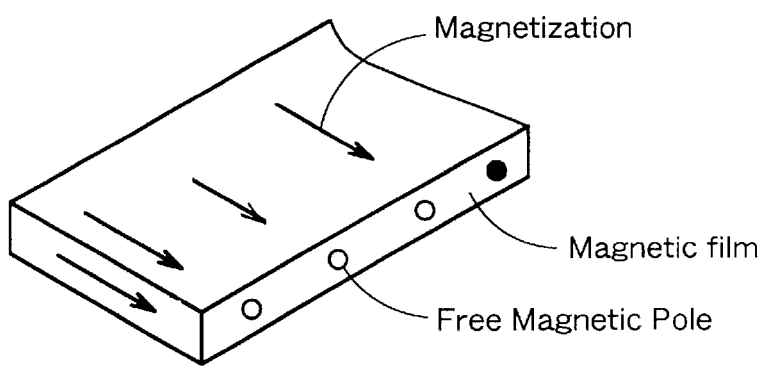
(B)
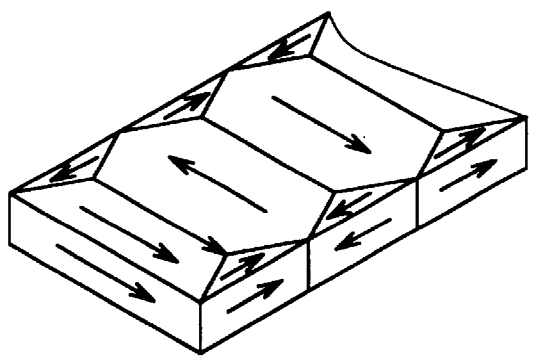
(C)
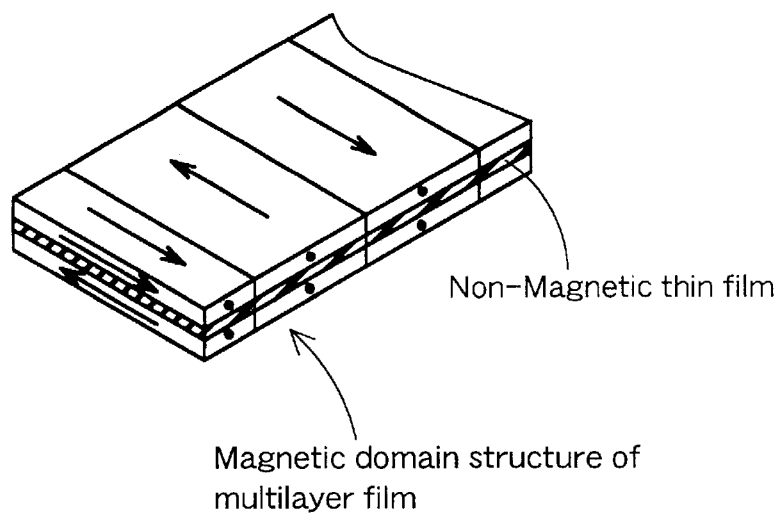

MAGNETIC SENSOR DEVICE

BACKGROUND OF THE INVENTION

1. Field of the Invention

The present invention relates to a magnetic sensor device which detects a change in magnetic properties of a magnetic material caused by an external magnetic field by using an imaginary part of complex magnetic permeability of the magnetic material, that is, characteristics of a frequency range in which the magnetic material loses its own properties. More particularly, the present invention relates to a magnetic sensor device which is used to detect a magnetic pattern stored through magnetization, such as a magnetic head of a hard disk drive or the like, a rotary encoder for use in a motor or the like, or a magnetic head of a barcode reader, and which is used for a signal transmitter which transmits a signal through a magnetic field excited by an electric signal in a digital household electrical appliance such as a mobile telephone, a DVD (a digital versatile disc) or a digital television, or the like.

2. Description of the Prior Art

Recent advances in microelectronics and digital signal processing technology yield rapid progress in size reduction and performance improvement of a mobile telephone, AV equipment, a personal computer and the like. The performance of the above-mentioned digital information equipment is determined by the capability of processing a digital signal, namely, the number of bits of a signal which can be processed per unit second. Consequently, possible advances in the digital equipment continue requiring a higher processing speed of all components to be used in the equipment.

A magnetic sensor has played an important part in the above-mentioned equipments. For example, the magnetic sensor is used for various applications such as the reading of information stored in a magnetic storage medium and a rotary encoder for use in a motor of the storage medium. However, the prior arts have reached the limit of the capability to keep and develop the part of the magnetic sensor in the future, and therefore the technology of speeding up processing requires the development of a magnetic sensor device based on a new principle capable of speeding up processing.

As a magnetic sensor using a magnetic material, an MR sensor (a magneto-resistance effect sensor) and a GMR sensor (a giant magneto-resistance effect sensor) have been heretofore developed, and a new sensor called an MI device (a magneto-impedance device) has been recently developed. However, none of the sensors can yet meet a request to the magnetic sensor, such as the speedup of processing incident to the processing of a rapidly increasing amount of information.

Both the MR sensor and the GMR sensor are sensors which function in the following manner: that is, a change in a spin direction in a magnetic material is caused by an external magnetic field, consequently this change causes a change in electrical resistance of the magnetic material, and thus each sensor detects the amount of change in electrical resistance as the amount of external magnetic field. An advantage of these sensors is that the sensors can directly detect DC resistance of the magnetic material without the need for a specifically designed circuit without the passage of an alternating current, as distinct from the MI device. However, the nonuse of a change in magnetic properties caused by the alternating current causes a threshold detectable frequency to lie in low frequencies. The reason is as follows.

FIG. 1 shows a magnetic field to be detected by a GMR sensor and output characteristics of a resistance change (an output change) of the GMR sensor. From a plot shown in FIG. 1, it can be seen that the output change of the GMR sensor has hysteretic resistance output relative to positive and negative magnetic fields to be detected. This means that a magnetic material remains partly magnetized by the magnetic field to be detected. In other words, the following phenomenon emerges: that is, when a positive or negative magnetic field to be detected is applied to the GMR sensor, the GMR sensor does not keep up with a change in the magnetic field and is thus not restored to its original state. This shows that the GMR sensor is a sensor disadvantageous for detection of a change in high frequencies of the magnetic field to be detected.

Causes of output hysteresis include hysteresis of magnetic properties (a B-H curve) of a magnetic material, and magnetic aftereffect. Because of these magnetic loss phenomena, there is a threshold frequency which does not change with an external magnetic field and cannot be detected.

That is, the GMR sensor is a sensor which is used in a frequency band in which magnetic properties such as magnetic permeability of a magnetic material that is little affected by threshold and lower frequencies at which a loss such as the magnetic aftereffect increases have uniform properties, and the GMR sensor has usable frequencies which are generally as low as about one-tenth of the threshold frequency at which the loss increases.

Next, the description is given with regard to a problem of the MI device. The MI device is a magnetic sensor which is driven by the passage of an alternating current and can thus perform detection with far higher sensitivity than the GMR sensor without causing output hysteresis that is a problem of the GMR sensor.

The MI device is a sensor which functions in the following manner: that is, the passage of an alternating current causes a change in a magnetic field to be detected, thus the change in the magnetic field causes a change in effective magnetic permeability of a magnetic material acting on the current, and thus the change in the magnetic permeability causes a change in reactance acting on the current and also causes a change in resistance by a skin effect, so that the magnetic field to be detected causes a change in AC impedance of two components, i.e., the reactance and the resistance.

In other words, the principle of the MI device is that the MI device is a sensor which utilizes a change in the effective magnetic permeability of the magnetic material, namely, a change in a real part of complex magnetic permeability of the magnetic material, and thus a threshold detectable frequency of the MI device depends on a threshold value of the effective magnetic permeability of the magnetic material (i.e., the real part of the complex magnetic permeability thereof). Similarly to the MR and GMR sensors, the MI device must be therefore used in a band of relatively low frequencies in which the effective magnetic permeability is little affected by an increase in an imaginary part of the complex magnetic permeability and is thus uniform, not near the threshold frequency at which the imaginary part of the complex magnetic permeability increases sharply.

There are two general, typical phenomena of magnetic properties which occur when an external magnetic field is applied to the sensor. One phenomenon is a change in the effective magnetic permeability which is caused by a change in the spin direction for use in the conventional magnetic sensors such as the MR and GMR sensors and the MI device.

The other phenomenon is a change in a frequency range in which the real part that is an effective component of the complex magnetic permeability decreases sharply and the imaginary part that is a loss component of the complex magnetic permeability increases sharply, in other words, a threshold frequency range in which the magnetic material loses its own properties.

SUMMARY OF THE INVENTION

The present invention provides a magnetic sensor device which uses a change in a threshold frequency caused by an external magnetic field as means for detecting the external magnetic field. More specifically, a new detecting method that does not require a uniform effective magnetic permeability is envisaged to overcome the problems of conventional detecting methods that require the uniform effective magnetic permeability, and thus the magnetic sensor device is designed so that the device can increase a response frequency to high frequencies about 10 times the threshold frequency even if the device uses a magnetic material having the same threshold frequency characteristics.

FIG. 2 is a graph showing the correlation between a magnetic field to be detected and complex magnetic permeability of a magnetic material. As shown in the graph of FIG. 2, when the complex magnetic permeability of the magnetic material is changed from $\mu1$ to $\mu2$ by the magnetic field to be detected, a real part $\mu1'$ of the complex magnetic permeability changes to $\mu1''$, and an imaginary part $\mu2'$ of the complex magnetic permeability changes to $\mu2''$. MR and GMR sensors, an MI device and the like, which have been heretofore used, are used in a frequency range A in which the imaginary part of the complex magnetic permeability does not increase, and the sensors and the like utilize a physical phenomenon in which the real part of the complex magnetic permeability changes from $\mu1'$ to $\mu2'$. On the other hand, the magnetic sensor device of the present invention uses a frequency range B in which the real part of the complex magnetic permeability decreases and the imaginary part thereof increases, and the device utilizes a physical phenomenon in which the increasing and decreasing frequencies are shifted by the magnetic field to be detected.

It is an object of the present invention to provide a magnetic sensor device capable of detecting a magnetic storage pattern recorded at high density and a magnetic field to be detected such as a magnetic field changing at high speed, with high sensitivity at high speed.

A magnetic sensor device of the present invention comprises: a magnetic material to which a magnetic field to be detected is applied; and oscillating means for oscillating in a threshold frequency range of the magnetic material, wherein the oscillating means oscillates in a transient threshold frequency range in which a loss component that is an imaginary part of complex magnetic permeability of the magnetic material increases and effective magnetic permeability that is a real part of the complex magnetic permeability decreases sharply, thereby detecting a change in the magnetic field to be detected as a change in an oscillation frequency in the threshold frequency range.

In the magnetic sensor device, the threshold frequency range of the magnetic material may be near a magnetic resonance frequency of the magnetic material.

Another magnetic sensor device of the present invention which detects a change in a magnetic field to be detected and outputs a detection signal indicative of the change in the magnetic field to be detected comprises: a magnetic material; and an oscillator circuit which sets an oscillation frequency to a frequency near a threshold frequency of the magnetic material and oscillates at the set oscillation frequency, wherein the oscillator circuit detects a change in the threshold frequency of the magnetic material caused by a change in a magnetic field to be detected as a change in the oscillation frequency of the oscillator circuit, and outputs the change in the magnetic field to be detected as the change in the oscillation frequency.

In the magnetic sensor device, the magnetic material may be included in a magnetic sensor, the magnetic sensor may have a conductor which lets a current of the oscillator circuit pass through, as well as the magnetic material, and the magnetic material may have much higher volume resistivity than the conductor has.

In the magnetic sensor device, the magnetic material may be included in a magnetic sensor, and the magnetic sensor may have the magnetic material, an electrical insulating layer, and a conductor which is located with the electrical insulating layer in between the conductor and the magnetic material, is affected by the threshold frequency of the magnetic material and lets a current of the oscillator circuit pass through.

In the magnetic sensor device, at least the magnetic material of the magnetic sensor may be formed as a thin film magnetic film by use of thin film process.

The magnetic film of the magnetic sensor device may be formed of a multilayer film comprising a magnetic layer and a nonmagnetic layer, which are stacked.

In the magnetic sensor device, the oscillator circuit may be formed on a semiconductor substrate on which the magnetic sensor is formed.

In the magnetic sensor device, a bias magnetic field generator for applying a bias magnetic field to the magnetic sensor may be provided near the magnetic sensor.

In the magnetic sensor device, the magnetic field to be detected may be a magnetic storage pattern stored through magnetization.

In the magnetic sensor device, the magnetic field to be detected may be a magnetic field generated by an electric signal generated by a coil.

FIG. 3 is an illustration of a basic configuration of the magnetic sensor device of the present invention. As shown in the illustration of the configuration, the magnetic sensor device has a magnetic sensor 1 having a magnetic material whose threshold frequency is changed by a magnetic field to be detected, and the device has the so-called electromagnetically-coupled current path which is affected by the magnetic material in order to electrically detect the threshold frequency of the magnetic material. The current path is connected to an oscillator circuit 8, which is set so that its oscillation frequency is changed by a change in the threshold frequency of the magnetic sensor 1. A capacitor 7 connected to the circuit 8 is provided in order to prevent the influence of a parasitic capacitance, and in some cases, the capacitor 7 is not particularly required.

In the magnetic sensor device, the magnetic field to be detected causes a change in the oscillation frequency of the oscillator circuit 8, and the change in the frequency is extracted as a magnetic field detection signal. More specifically, a change in the threshold frequency of the magnetic material of the magnetic sensor 1 caused by the magnetic field to be detected is extracted as a change in an output frequency of the oscillator circuit 8, and the change in the output frequency is used as the magnetic field detection signal.

The above-described magnetic sensor device of the present invention is different from the prior arts in an available complex magnetic permeability range of the magnetic material, as described below. More specifically, the magnetic sensor device of the present invention utilizes a magnetic phenomenon in which higher magnetic permeability leads to a lower threshold frequency and lower magnetic permeability leads to a higher threshold frequency, which has not been heretofore used as means for detecting the magnetic field to be detected.

In order to utilize the above-mentioned physical phenomenon, the magnetic sensor device of the present invention does not detect a frequency range in which a real part that is an effective component of the complex magnetic permeability is uniform, and the device uses a frequency range in which a loss component increases sharply, namely, a threshold frequency range in which the magnetic material loses its own properties and thus has transient magnetic properties. Therefore, the magnetic sensor device can realize a response frequency about 10 times a response frequency of the prior arts, even if the device uses a magnetic material having the same threshold frequency.

As distinct from the prior arts, the magnetic sensor device of the present invention does not detect a change in a magnetic field as resistance and reactance, namely, impedance but detects the change as a frequency that can be easily subjected to digital information processing, namely, the threshold frequency.

Furthermore, the magnetic sensor device of the present invention detects a change in the threshold frequency caused by the magnetic field to be detected as a change in frequency of the same order without changing the order, and also outputs the change in the threshold frequency. This makes it possible to eliminate the attenuation of the amount of detected change and also makes it possible to directly convert even a pulse signal suitable for digital information processing into a frequency causing no information loss or time information such as a cycle, and therefore this allows eliminating the so-called analog information such as amplitude or phase of the prior arts.

Next, the description is given with regard to the magnetic sensor device of the invention in which the threshold frequency range is set to near the magnetic resonance frequency and the magnetic sensor is made of a thin magnetic film.

In the magnetic sensor device having this configuration, a change in the magnetic field to be detected near the magnetic sensor causes a change in the oscillation frequency of the oscillator circuit (i.e., a frequency near the magnetic resonance frequency of the magnetic film) according to a magnetic storage pattern of the magnetic field to be detected or the like. A frequency signal output from the oscillator circuit is demodulated by, for example, an FM demodulator circuit, which then operates so as to output a magnetic storage pattern (recorded information) of a magnetic disk or the like.

The thin magnetic film of the magnetic sensor has a film thickness much smaller than its surface area, and thus has a structure advantage for high frequencies. More specifically, the thin magnetic film does not cause a loss due to the skin effect incident to a high-frequency current or a high-frequency magnetic field but causes a sharp change in magnetic properties near the magnetic resonance frequency (also called the threshold frequency) of the magnetic film, and extracts as information a change in the oscillation frequency of the oscillator circuit changing according to the change in magnetic properties. Therefore, the thin magnetic film makes it possible to read information at a higher rate of 200 Mbit/s or higher, for example.

The oscillator circuit of the magnetic sensor device is located as close to the magnetic sensor as possible, and this can reduce the influence of parasitic capacitance or parasitic impedance of wirings or the like generated by high frequencies. Moreover, the magnetic film of the magnetic sensor is formed with the least possible thickness, and this can reduce an alternating loss due to the skin effect incident to a high-frequency current or a high-frequency magnetic field and therefore enables operation at high frequencies. As described in claim 5, the magnetic film of the magnetic sensor is electrically insulated from the conductive layer. This prevents the following phenomenon: when a high-frequency current passes through the magnetic film, the impedance increases, thus the Q-value indicative of ease of oscillation deteriorates, and consequently a high-frequency loss increases.

The above-described magnetic sensor device of the present invention is different from the MI device of the prior art in its structure and function, as described below. More specifically, the magnetic sensor device causes an alternating current to generate an alternating field in the magnetic film in the same manner as the MI device, but the magnetic sensor device does not use an impedance change caused by the magnetic field to be detected but uses a change in the magnetic resonance frequency of the magnetic film caused by the magnetic field to be detected so as to detect the magnetic field to be detected, as distinct from the MI device.

The magnetic resonance frequency is the highest threshold frequency at which the magnetic material functions. When the frequency reaches the magnetic resonance frequency, the magnetic permeability of the magnetic material decreases sharply, and magnetic energy generated by the alternating current changes sharply into heat, which changes to a loss. In other words, at the magnetic resonance frequency, the real part of the complex magnetic permeability decreases sharply, and the imaginary part that is the loss component of the complex magnetic permeability increases sharply.

The magnetic sensor device of the present invention is significantly different from the MI device in principle in that the magnetic sensor device detects the magnetic resonance frequency. The MI device is a device which detects as impedance a change in the magnitude of magnetic flux generated around a part (i.e., a conductor) through which a current passes. Therefore, the MI device is a device which detects a change in magnetic reluctance of a magnetic path around the conductor. More specifically, the MI device depends on the shape of the magnetic path, such as the cross-sectional area thereof and the length thereof. On the other hand, the magnetic resonance frequency is properties which basically depend on physical properties of the magnetic film. A change in the magnetic resonance frequency caused by the magnetic field to be detected is a universal physical phenomenon which occurs in any magnetic material.

Accordingly, it is advantageous to the MI device to increase impedance on which an output change is based, and therefore a smaller-sized MI device tends to lead to a smaller amount of change in impedance. A more suitable material for high frequencies is prone to reduce an absolute value of impedance, and it is, in general, very difficult to form a circuit configuration for detecting the amount of change in impedance at high frequencies. Therefore, the MI device is not suitable for a smaller size and higher frequencies.

On the other hand, the magnetic sensor device of the present invention detects properties in themselves of the magnetic material. When the magnetic materials have the same magnetic resonance frequency in the original state under no magnetic field to be detected, namely, the same natural magnetic resonance frequency, a change in the magnetic resonance frequency is also substantially the same. Therefore, the magnetic sensor device can be formed freely without the limits of shape elements such as the film thickness, the cross-sectional area and the total volume of the magnetic material, so that the magnetic sensor device can be reduced in size freely compared with prior magnetic sensor devices.

In general, the magnetic film having a multilayer structure comprising a magnetic material alternating with a nonmagnetic material has a very high magnetic resonance frequency, and the magnetic film markedly exhibits the tendency, particularly when the nonmagnetic material is made of an insulating film. Therefore, even when the magnetic film is made of a thin film of 30 nm or less thick, the magnetic resonance frequency of the magnetic film can be increased to higher frequencies of 200 MHz or higher, for example. Furthermore, the magnetic film can undergo microfabrication. Therefore, even the current technology can reduce the width of the magnetic film to 200 nm or less, for example. Accordingly, information on a magnetic recording surface can be read from a narrow magnetic storage area of 200 nm wide and 30 nm or less thick at a higher rate of, for example, 200 Mbit/s or higher by using the magnetic sensor device having the thin film magnetic sensor having a magnetic detector area smaller than the magnetic storage area.

BRIEF DESCRIPTION OF THE DRAWINGS

FIGS. 20A to 20C are illustrations of magnetic domain structures;

DESCRIPTION OF THE PREFERRED EMBODIMENTS

Embodiments of the present invention will be described below with reference to the drawings.

First Embodiment

Figure 1:
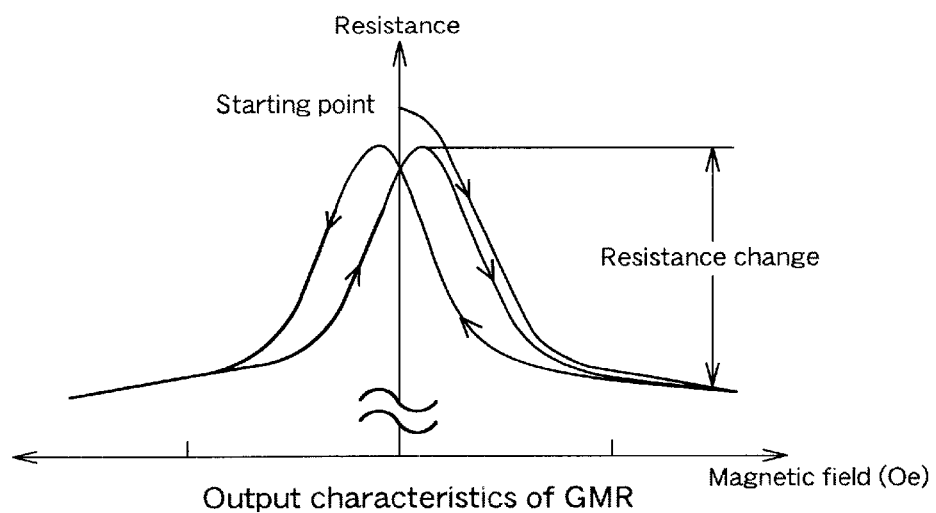
FIG. 1 is a graphical representation of output characteristics of a conventional GMR sensor.
Figure 2:
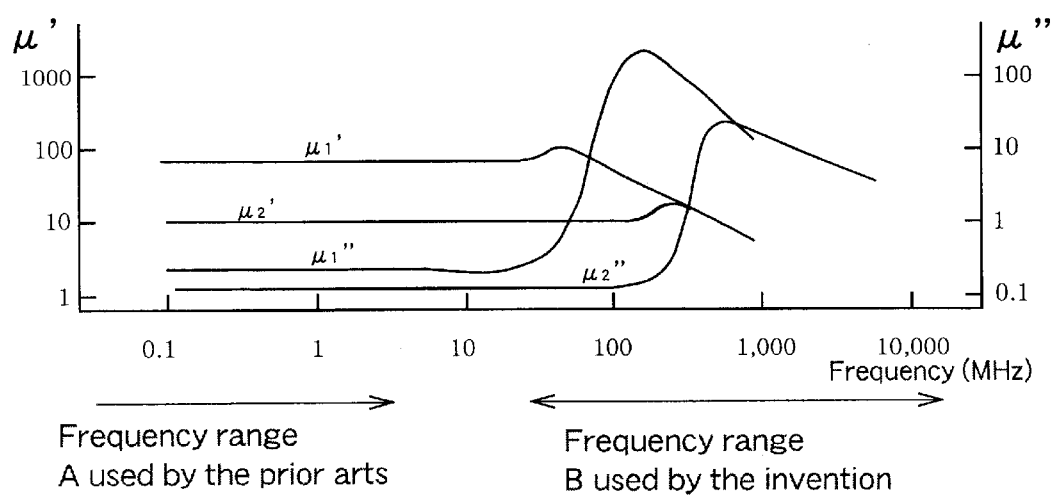
FIG. 2 is a graph showing the correlation between complex magnetic permeability and a usable frequency range of a conventional magnetic sensor device and a usable frequency range of a magnetic sensor device of the present invention.
Figure 3:
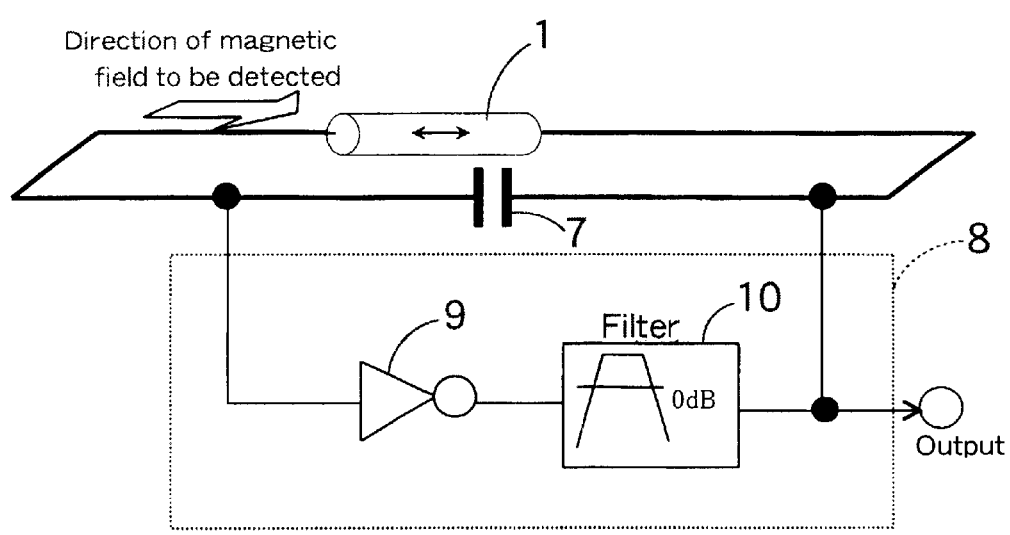
FIG. 3 is an illustration of a basic configuration of a magnetic sensor device of the present invention.
Figure 4:
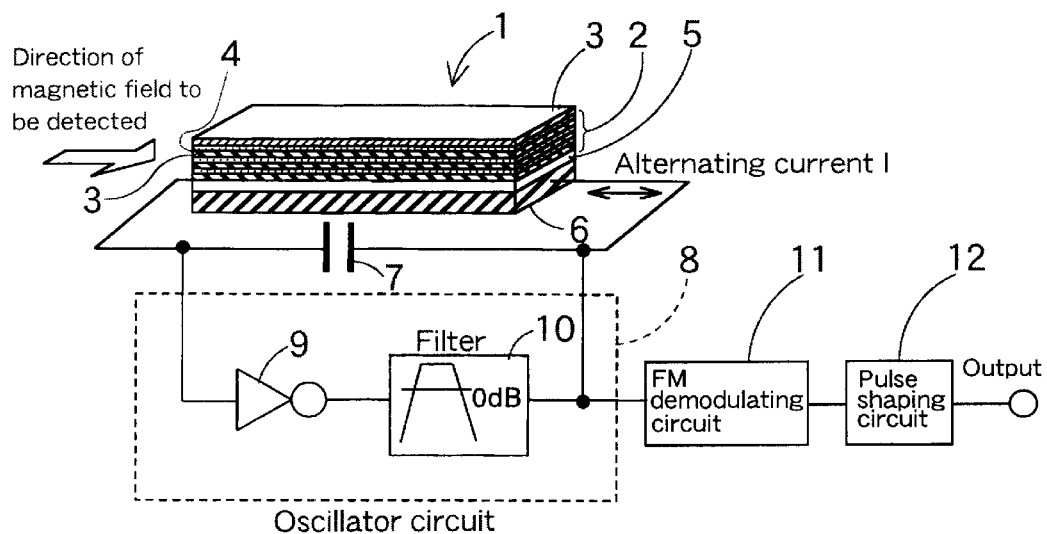
FIG. 4 is a schematic illustration of a configuration of a magnetic sensor device according to a first embodiment of the present invention.

FIG. 4 shows a schematic illustration of a configuration of a magnetic sensor device according to a first embodiment. A thin film magnetic sensor 1 has a structure comprising a conductive layer 6 made of Cu or Al of, for example, 0.5 m thick, an insulating layer 5 of, for example, 0.1 m thick formed on the conductive layer 6 by means of deposition or the like, and a magnetic film 2 of, for example, 30 nm thick formed on the insulating layer 5 by means of deposition or the like. The magnetic film 2 has a multilayer structure comprising a magnetic layer 3 made of a soft magnetic amorphous metal such as CoSiB or FeNbZr of 1 nm thick, and a nonmagnetic layer 4 made of Cu of 1 nm thick, which are formed by means of deposition. The magnetic film 2 has very minute dimensions, for example, a width of 30 nm or less and a length of 200 nm or less.

The magnetic film 2 is a magnetic film for use in magnetic detection, which has a magnetic resonance frequency that is changed by a magnetic field to be detected. The magnetic film 2 comprises a multilayer film comprising the magnetic layer 3 and the nonmagnetic layer 4, but the magnetic film 2 comprising a single-layer film made of a magnetic material is also feasible in principle. Although the nonmagnetic layer 4 is made of a metal film, the nonmagnetic layer 4 may be made of an insulating film. The conductive layer 6 is located near the magnetic layer 3 in order to convert a magnetic change that occurs near the magnetic resonance frequency of the magnetic film 2 into a change in electrical characteristics. The magnetic film 2 is located so that a change in magnetic permeability of the magnetic film 2 caused by a magnetic field to be detected affects a current magnetic field passing through the conductive layer 6. The thin film magnetic sensor 1 can be formed in such a manner that the conductive layer 6 is formed over or under the magnetic film 2. The conductive layer 6 is insulated from the magnetic film 2 by the insulating layer 5 in order to reduce a resistance component at high frequencies.

As shown in FIG. 4, a capacitor 7 is connected in parallel to both ends of the conductive layer 6 of the thin film magnetic sensor 1, and an oscillator circuit 8 is connected in parallel to the capacitor 7. The capacitor 7 is connected in parallel to the conductive layer 6 in order to stabilize a capacitance component that is parasitic on the conductive layer 6 and in order to control oscillation conditions. The oscillator circuit 8 has an amplifier 9 and a filter 10, and an FM demodulating circuit 11 is connected to an output of the oscillator circuit 8 in order to extract only the amount of change in a magnetic field to be detected. Furthermore, a pulse shaping circuit 12 is connected to an output of the FM demodulating circuit 11 in order to digitize an output from the FM demodulating circuit 11.

The oscillation conditions of the oscillator circuit 8 are determined by the impedances of the capacitor 7 and the conductive layer 6 and the impedance of the filter 10. The oscillation conditions are set to conditions under which a sharp change in impedance occurs near a frequency at which the magnetic resonance frequency changes, and thus an oscillation frequency is typical of the magnetic resonance frequency. Moreover, a magnetic field to be detected causes a change in the magnetic resonance frequency, and thus this change also causes a change in the oscillation frequency, so that a change in the magnetic field to be detected can be extracted as a signal.

The thin film magnetic sensor 1 detects a change in the magnetic resonance frequency of the magnetic film 2 caused by a magnetic field to be detected, as an electrically-extractable physical quantity, by using an electrical change in the conductive layer 6. Since it is the magnetic resonance frequency, i.e., a frequency that should be detected, the easiest detection is, of course, to detect the physical quantity to be detected as the frequency. Accordingly, a change in complex magnetic permeability of the magnetic film 2 near the magnetic resonance frequency causes a sharp change in the impedance of the conductive layer 6, and therefore the incorporation of the change in the impedance into the oscillation conditions of the oscillator circuit 8 allows detecting a change in the magnetic resonance frequency caused by a magnetic field to be detected as a change in the oscillation frequency. The description is given later with regard to the complex magnetic permeability.

The above-described thin film magnetic sensor 1 is mounted to a magnetic head of a magnetic disk unit or the like (not shown), then a magnetic recording surface of a magnetic disk is moved near the thin film magnetic sensor 1, thus this movement causes a change in a magnetic field to be detected, the change in the magnetic field to be detected causes a change in a magnetic resonance frequency of the thin film magnetic sensor 1, the change in the magnetic resonance frequency causes a change in an oscillation frequency of the oscillator circuit 8, and thus the oscillator circuit 8 outputs a frequency signal indicative of a magnetic storage pattern of the magnetic disk. The frequency signal output from the oscillator circuit 8 is transmitted to the FM demodulating circuit 11, then the FM demodulating circuit 11 extracts a waveform signal indicative of the demodulated magnetic storage pattern through demodulation of the frequency signal and transmits the waveform signal to the pulse shaping circuit 12, and then the pulse shaping circuit 12 subjects the waveform signal to waveform shaping and digitization and outputs a signal indicative of the waveform-shaped, digitized magnetic storage pattern.

[Description of Complex Magnetic Permeability]

When a magnetic material is being magnetized through the application of a high-frequency alternating field to the magnetic material, various losses increase as the frequency of the applied alternating field increases. These losses are caused by phase delay resulting from a phenomenon in which a magnetic flux generated by the magnetization of the magnetic material cannot keep up with a change in the alternating field.

Letting an alternating field H be a sinusoidal alternating current, the following equations are obtained:

$$H = H_0 \cdot e^{i\omega}$$

$$B = B_0 \cdot e^{j(\omega - \delta)}$$

where denotes the phase delay, and B denotes the generated magnetic flux.

If the following equations are set up, $$\mu = B/H = H_0 \cdot e^{i\omega}/B_0 \cdot e^{j(\omega-\delta)} = (B_0 \cdot \cos \delta/H_0) - j(B_0 \cdot \sin \delta/H_0)$$

$$\mu' = B_0 \cdot \cos /H_0$$

$$\mu'' = B_0 \cdot \sin /H_0$$

magnetic permeability $\mu$ can be therefore expressed by the following equation.

$$\mu = \mu' - j\mu''$$

The above-mentioned magnetic permeability $\mu$ is composed of a real part $\mu'$ and an imaginary part $\mu''$, and the magnetic permeability $\mu$ is complex magnetic permeability. Since the imaginary part $\mu''$ represents a component of the magnetic flux B whose phase lags 90 degrees behind the alternating field H. energy is necessary to magnetize the component, and therefore the imaginary part $\mu''$ is typical of a loss which dies out as heat in the magnetic material. Next, the description is given with regard to the loss of the magnetic material.

[Loss of Magnetic Material]

The application of an alternating field to a magnetic material at high frequencies causes the occurrence of various losses. The description is given with regard to losses which occur in increasing order of frequencies of the applied alternating field. Firstly, a hysteresis loss is a loss which occurs at the lowest frequency. The hysteresis loss refers to an area surrounded by a hysteresis loop formed by a magnetization curve. More specifically, the hysteresis loss is a loss which is consumed and transformed into heat energy through the application of an alternating field at every cycle of application. The hysteresis loss increases in proportion to the frequency. Therefore, a magnetic material for use in up to high frequencies requires properties of a soft magnetic material that does not form the hysteresis loop.

Secondly, it is an eddy current loss that becomes a problem as the frequency becomes higher. The eddy current loss is that an alternating field causes electromagnetic induction to generate an eddy current in a magnetic material, and the current passes through the magnetic material and changes into heat, which is thus consumed. In, in particular, a magnetic material having a magnetic domain structure whose magnetic domain wall is prone to shift, the eddy current passes through the magnetic material intensively near the magnetic domain wall, so that the loss is 2 or more times the loss which occurs on the assumption that the magnetic domain wall does not shift.

Moreover, the eddy current loss can be described as a skin effect. This indicates that as the frequency becomes higher, the skin effect causes a surface of a magnetic material to undergo intensive magnetization and thus causes the inside thereof to undergo no magnetization. The skin effect causes a magnetic path to be narrower or causes a magnetic flux to have a more phase lag in the interior farther from the surface, so that the loss occurs.

There are losses due to magnetic after effect and so on, in addition to the above-described losses. Even if all the losses are eliminated, the magnetic material has the limit of usable frequencies, namely, the limit of frequencies at which the magnetic material functions. The limit of frequencies is the magnetic resonance frequency. Next, the description is given with regard to the magnetic resonance frequency.

[Description of Magnetic Resonance Frequency]

The magnetic material is magnetized in the following manner: that is, the spin of the magnetic material is oriented in the direction of an alternating field by the alternating field and thus changes into a magnetic flux, and thus, magnetization takes place. However, as the frequency increases, the movement of the spin cannot keep up with a change in the alternating field, this causes phase delay, and finally, the spin does not move at all.

More specifically, the spin keeps up with the change in the alternating field below a predetermined frequency of the alternating field, but the spin abruptly stops keeping up with the change at the predetermined frequency, and thus the phase delay, namely, a loss component $\mu''$ increases sharply, so that the magnetic material finally approaches a state in which the spin does not keep up with the change at all, that is, a state in which the magnetic material does not function.

In other words, the rotation of the spin lags in phase behind the applied alternating field, thus the phase lag causes the presence of a phase in which the loss component $\mu''$ has a maximum value, and a frequency of the phase is a magnetic resonance frequency.

The magnetic resonance frequency is a resonance phenomenon as its name implies. This phenomenon refers to the highest frequency at which the magnetic material functions, and the phenomenon can be described as precession of atoms. Fine particles such as atoms have a magnetic moment and thus rotate around the direction of a magnetic field. The rotation is called the Larmor precession. The frequency of the precession is affected by the magnetic field strength.

However, Even if a magnetic field to be detected is not applied to the magnetic material, the magnetic material, has various magnetic anisotropies, and thus the magnetic material moves in the same manner as the magnetic material to which a magnetic field corresponding to the anisotropies is applied. The frequency of this precession is eventually the magnetic resonance frequency. The frequency of an externally applied alternating field gets closer to the magnetic resonance frequency, and this causes the resonance phenomenon. Because of the resonance phenomenon, the phenomenon brings about a dramatic change in the precession near the frequency. That is, when all frequencies match, almost all energy of the externally applied alternating field is transformed into the precession, which is eventually transformed into heat energy. Therefore, the imaginary part ($\mu''$) has the maximum value.

The real part $\mu'$ of the magnetic permeability is also affected by the resonance phenomenon. Prior to the resonance phenomenon, the real part $\mu'$ exhibits a slight increase, and changes to a sharp decrease. This is a phenomenon which generally emerges, such as resonance. The sharp decrease means a sharp decrease in a magnetic flux generated by an applied alternating field, namely, effective magnetic permeability, due to the stop of spin movement.

Figure 5:
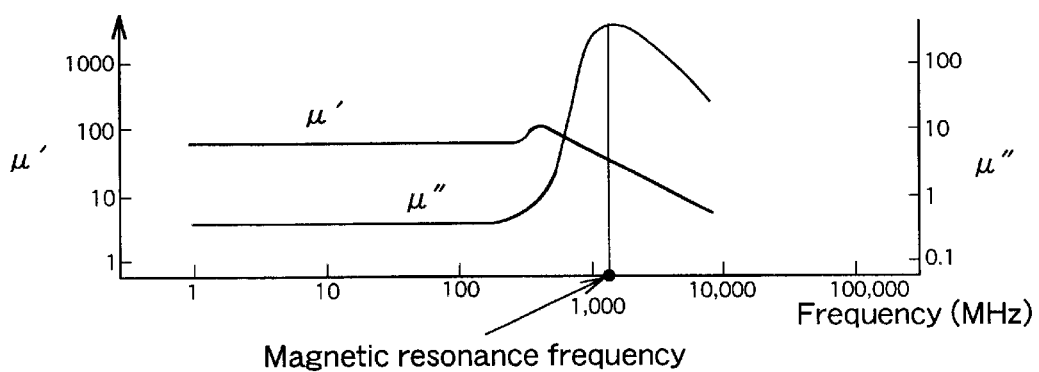
FIG. 5 is a graphical representation of the correlation between a magnetic resonance frequency and complex magnetic permeability.

FIG. 5 shows the correlation between a change in actual complex magnetic permeability ($\mu'$ and $\mu''$) and a magnetic resonance frequency. The magnetic resonance frequency is a frequency at which the loss component $\mu''$ has the maximum value due to the resonance phenomenon, and $\mu'$ sharply decreases near the magnetic resonance frequency. In the present invention, a sharp change in $\mu'$ and $\mu''$ of the magnetic material near the magnetic resonance frequency is used to detect external magnetism.

Even below the magnetic resonance frequency, for example, the above-mentioned various causes may, however, lead to the occurrence of losses of the magnetic material and thus to a sharp change in the complex magnetic permeability ($\mu'$ and $\mu''$) as in the case of the magnetic resonance frequency. Moreover, a frequency at which a sharp increase in loss takes place may be changed by a magnetic field to be detected. Detection of these changes makes it possible to detect the magnetic field to be detected, and therefore, in a wide sense, this detection is covered in the concept of detection of the magnetic resonance frequency. The use of the magnetic resonance frequency capable of detecting magnetism at up to the highest frequency has high utility value in the future. Next, the description is therefore given with regard to a change in the magnetic resonance frequency caused by the magnetic field to be detected.

[Change in Magnetic Resonance Frequency Caused by Magnetic Field to be Detected]

The magnetic resonance frequency is changed in the following manner by the magnetic field to be detected. More specifically, the magnetic resonance frequency corresponds to the atomic-level precession as described above, and therefore the magnetic resonance frequency can be expressed by the following theoretical equation using electric charge of electrons and so on:

$$\omega = g \cdot \mu_0 \cdot e \cdot H / 2m$$

where denotes a magnetic resonance angular frequency, $\mu_0$ denotes space permeability, e denotes the charge of electrons, m denotes the mass of the electrons, g denotes a gyro-magnetic ratio, and H denotes the magnetic field.

Then, the following equation is set up:

$$\gamma = g \cdot \mu_0 \cdot e \cdot /2m$$

where γ denotes a gyro-magnetic constant.

Therefore, the above equations lead to the following equation.

$$\omega = \gamma \cdot H$$

The magnetic resonance frequency is generally given by the above equation, and the conclusion is that the magnetic resonance frequency is proportional to the magnetic field and the gyro-magnetic constant. In general, the magnetic material has the magnetic resonance frequency which does not become equal to 0 even in the absence of the magnetic field to be detected. Therefore, the magnetic resonance angular frequency under no external magnetic field is called a natural magnetic resonance angular frequency $\omega_0$, which is expressed as the following equation:

$$\omega_0 = \gamma \cdot Ha$$

where Ha denotes an anisotropy field. The magnetic material has any magnetic anisotropy, and the existence of the magnetic anisotropy causes the magnetic material to be affected by spontaneous magnetization Is, so that the magnetic resonance frequency does not become equal to 0. The magnetic field, namely, the anisotropy field Ha, which causes the spontaneous magnetization, is expressed by the following equation:

$$Ha = 2K_1/Is$$

where $K_1$ denotes an anisotropy constant.

Furthermore, the magnetic resonance angular frequency ω, an effective field $H_{eff}$ of the frequency and a demagnetizing field $H_{dem}$ of the frequency are expressed as the following equations.

$$\omega = \gamma \cdot H_{eff} + \omega_0$$

$$H_{eff} = H_{ex} - H_{dem}$$

$$H_{dem} = N_{dem} \cdot M/\mu_0$$

Conclusively, the magnetic resonance frequency (ω) starts increasing at the natural magnetic resonance frequency ($\omega^0$) through the application of the magnetic field ($H_{ex}$) to be detected. The effective field $H_{eff}$ is dominantly concerned with the increase in the frequency, as expressed by the above equation.

The above equation will be qualitatively described. The application of the effective field to the magnetic material causes magnetic poles to emerge on ends of the magnetic material, and thus the demagnetizing field $H_{dem}$ is generated in the direction opposite to the effective field. Therefore, the effective field $H_{eff}$ which effectively acts on the magnetic material is expressed by a difference between the applied effective field and the demagnetizing field. The demagnetizing field is a coefficient which is called a demagnetizing field coefficient $N_{dem}$, and it is possible that the demagnetizing field coefficient is a coefficient into which part of a magnetization vector M is transformed.

Figure 6:
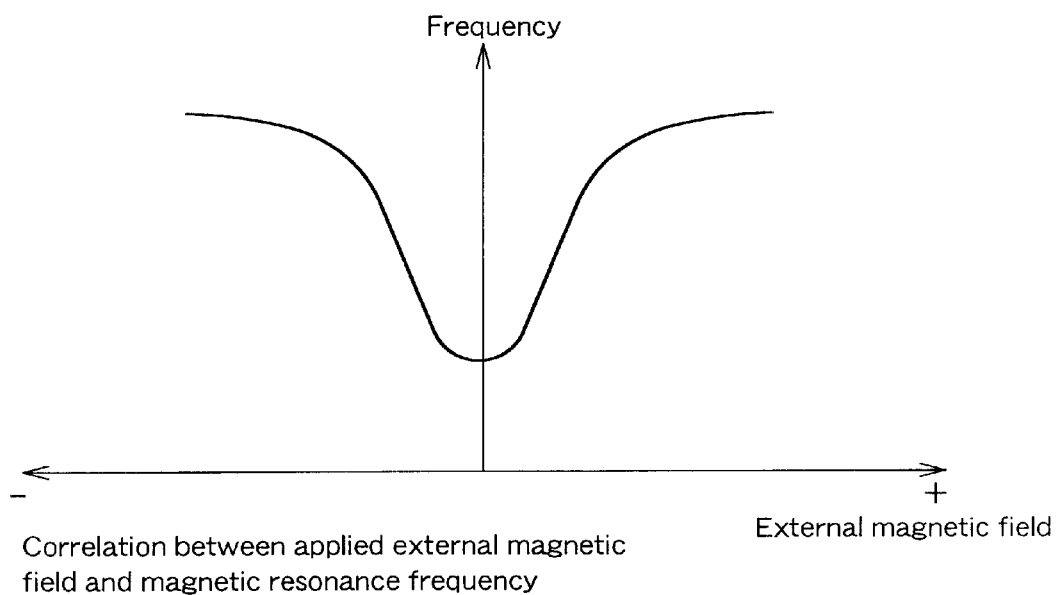
FIG. 6 is a graphical representation of the correlation between a magnetic field to be detected and a magnetic resonance frequency.

FIG. 6 shows the correlation among the magnetic field, the magnetic resonance frequency and the magnetic field to be detected. When the magnetic field to be detected is near 0, the rate of increase in the magnetic resonance frequency versus the magnetic field to be detected is low because the energy of the magnetic field to be detected is prone to be transformed into the magnetic domain wall energy and is susceptible to the demagnetizing field. When the magnetic field increases, the rate of increase in the magnetic resonance frequency versus the magnetic field to be detected decreases because the magnetic resonance frequency of the magnetic material is finite. The correlation between the magnetic field to be detected and the magnetic resonance frequency is as shown in FIG. 6 because the magnetic field to be detected has the same influence upon the magnetic resonance frequency regardless of the plus or minus sign (i.e., the positive or negative direction) of the magnetization vector. Next, the description is given with regard to the detection of the magnetic resonance frequency.

[Detection of Magnetic Resonance Frequency]

A change in the complex magnetic permeability of the magnetic material is converted into electrical characteristics. The change in the complex magnetic permeability of the magnetic material has an influence upon a change in electrical impedance, and magnetic impedance coupled to electrical impedance is indispensable for the detection of the change in the electrical impedance. More specifically, it is essential that a conductor part, which constitutes an electric circuit and lets a current pass through, be located adjacent to the magnetic material whose magnetic resonance frequency is to be changed by the magnetic field to be detected. Under the above-mentioned conditions, as generally known, the correlation between the magnetic impedance and the electrical impedance is expressed as the following equation:

$$Zm \cdot Z = j\omega N^2$$

where Zm denotes the magnetic impedance, Z denotes the electrical impedance, and N denotes the number of turns of a coil.

When the conductor is surrounded by the magnetic material, the number of turns of the coil is equal to 1, and therefore, assuming N=1 leads to the following equation:

$$Zm = L/(\mu' \cdot S)$$

where L represents a length of a magnetic circuit, S represents a cross-sectional area of the magnetic circuit, and μ' represents the complex magnetic permeability. The above equation leads to the following equations.

$$Z_L = j\omega S(\mu' - j\mu'')/L$$

$$Z_L = \omega S(\mu'' + j\mu')/L$$

As expressed by the above equations, at the electrical impedance Z, an imaginary part of a loss component of the magnetic impedance Zm is converted into a real part of the electrical impedance Z, namely, a resistance component (i.e., a loss) of the electric circuit, and similarly, a real part of the magnetic impedance Zm is converted into an imaginary part of the electrical impedance Z. This means that a loss of the magnetic circuit is converted into a loss even if the loss of the magnetic circuit is converted into a component of the electric circuit.

Therefore, the electrical impedance Z of the conductor coupled to the magnetic material allows the detection of a change in the magnetic permeability of the magnetic material, also allows the detection of a real part (i.e., effective magnetic permeability $\mu'$) of the magnetic permeability of the magnetic material as the imaginary part of the electrical impedance Z, and further allows the detection of an imaginary part (i.e., magnetic permeability $\mu''$ that is a loss component) of the magnetic permeability of the magnetic material as the real part (i.e., the loss) of the electrical impedance Z. Moreover, the electrical impedance Z allows the detection of an AC loss or the like of the conductor as the real part (i.e., the loss) of the electrical impedance Z. The real part of the electrical impedance Z indicates every loss component of the conductor, the magnetic material and the like, and the imaginary part thereof indicates a component that is not converted into a loss to be transmitted. The sensor, which detects up to the magnetic resonance frequency that is a very high frequency, must be therefore devised so that every loss of the magnetic material, the conductor and so on does not increase to the magnetic resonance frequency.

Next, the description is given with regard to an example of a change in electrical characteristics caused by the magnetic resonance frequency with reference to an impedance model diagram shown in FIG. 6. As described above, a change in the complex magnetic permeability can be detected as a change in the electrical impedance, and the electrical impedance actually changes in the following manner.

Figure 7:
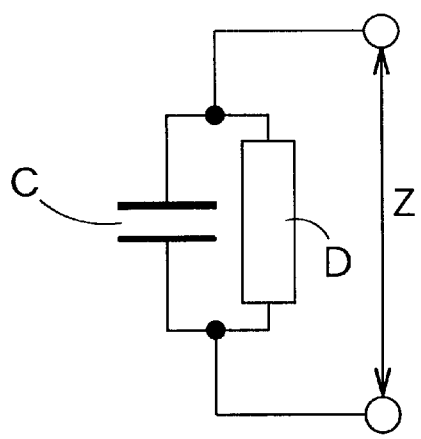
FIG. 7 is an impedance model diagram of a thin film magnetic sensor.

FIG. 7 shows a model in which a capacitor C is connected in parallel to a magnetic sensor D having a magnetic material and a conductor magnetically coupled to the magnetic material. Assume that the magnetic material has properties of complex magnetic permeability of a single-layer thin magnetic film made of a general amorphous metal provided with uniaxial magnetic anisotropy in order to bring its properties closer to actual magnetic properties. Impedance $Z_L$ of the magnetic sensor D and impedance $Z_C$ of the capacitor C can be expressed by the following equations.

$Z_L = \omega S(\mu'' + j\mu')/L$ $Z_L = Ksl \cdot \omega(\mu'' + j\mu')$

Assuming $Ksl = S/L = 10'-7$ leads to the following equations.

$Z = 1/j\omega C$ $C = 0.5 \, pF$ $1/Z = 1/ZL + 1/ZC$

Figure 8:
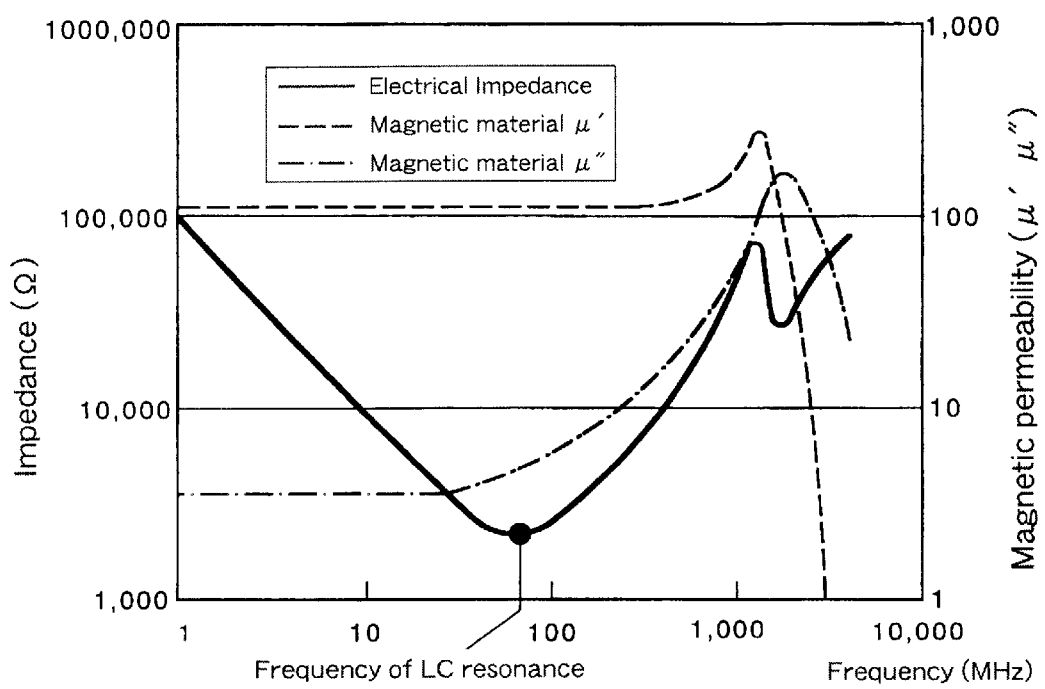
FIG. 8 is a graphical representation of the correlation between complex magnetic permeability and impedance.
Figure 9:
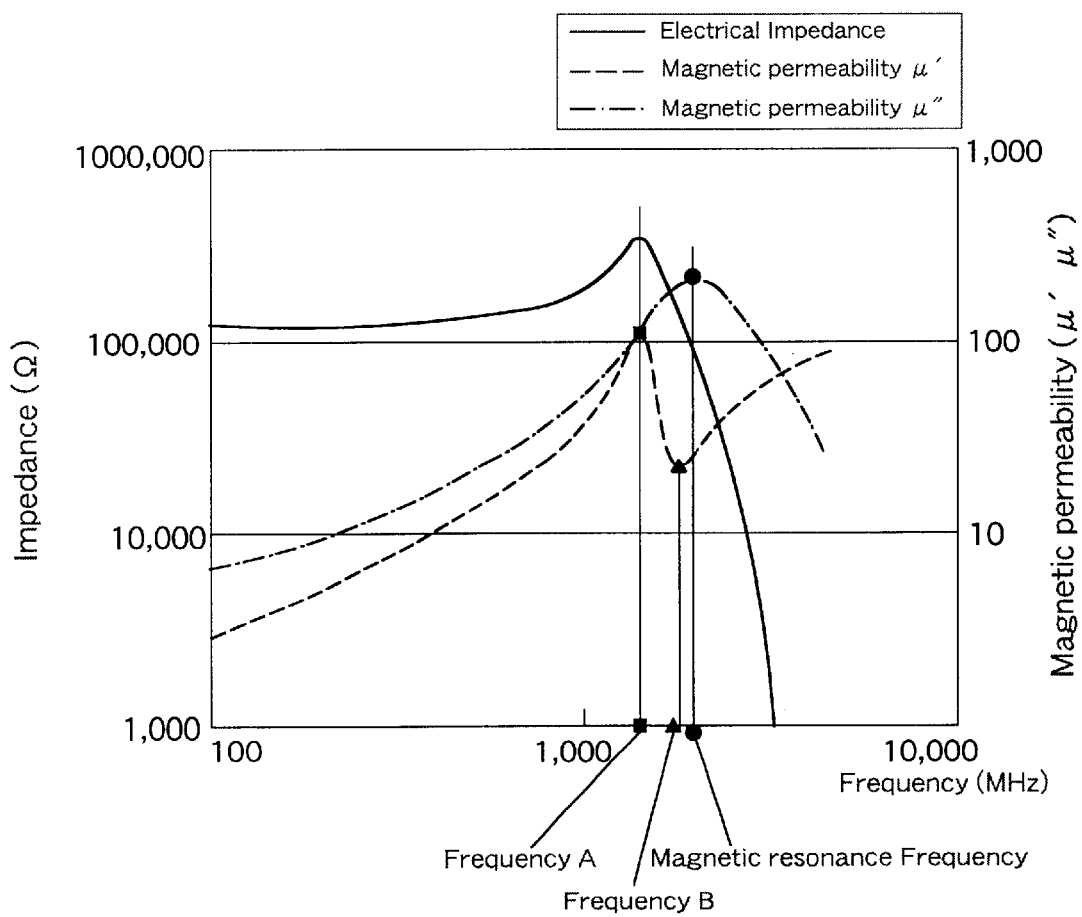
FIG. 9 is a graphical representation of the correlation between the complex magnetic permeability and the impedance near the magnetic resonance frequency.

At the above-mentioned impedance Z, as shown in FIGS. 8 and 9, the complex magnetic permeability $\mu'$ and the complex magnetic permeability $\mu''$ are about 120 and about 4, respectively, at low frequencies relative to an alternating field, and the magnetic resonance frequency is 2.1 GHz.

The impedance of both ends of the conductor is calculated from the complex magnetic permeability in the following manner. S/L which is a proportional constant in the equation is set equal to Ksl, the value Ksl is set to 10–7, and thus the impedance $Z_L$ of both the ends of the conductor of the magnetic sensor is calculated from the values of the complex magnetic permeability ($\mu'$ and $\mu''$). Assume that the capacitor C is a 0.5-pF capacitor.

In general, parasitic capacitance exists between the magnetic material and the conductor, the parasitic capacitance is considered to exist in parallel, and therefore the model in which the capacitor C is connected in parallel is used. Since the parasitic capacitance exists with no stability, the capacitor C having higher capacitance, a capacitance of 0.5 pF, is interposed so that the capacitor is not affected by a change in capacitance. If the capacitor C can obtain stable capacitance, it is not necessary to interpose the capacitor C in parallel.

A graph shown in FIG. 8 shows the changes in the impedance and the complex magnetic permeability versus the frequency, and incidentally, the impedance is calculated using the above equations in the case where the capacitance of the capacitor C, the magnetic resonance frequency, and the complex magnetic permeability ($\mu'$ and $\mu''$) are set in a circuit model shown in FIG. 7 as described above. The impedance Z to be calculated is equal to the sum of the impedance $Z_L$ of the magnetic sensor and the impedance $Z_C$ of the capacitor, which are connected in parallel. Incidentally, a high-frequency loss of the conductor caused by the skin effect or the like is neglected.

As shown in the graph of FIG. 8, it can be seen that the impedance Z has inflection points which greatly change near a frequency of 100 MHz and near a higher frequency of 1000 MHz, that is, near the magnetic resonance frequency. The inflection point near a lower frequency of 100 MHz is an LC resonance frequency, and the inflection point near 1000 MHz is the inflection point of the magnetic resonance frequency. The inflection point near 100 MHz is an inductance and C resonance caused by the substantially-uniform complex magnetic permeability $\mu'$, a change in impedance is mild near this frequency, and this indicates that the Q-value that is an index indicative of ease of oscillation is low.

FIG. 9 shows an enlarged graph of a change in impedance near the magnetic resonance frequency shown in the graph of FIG. 8. From the graph shown in FIG. 9, it can be seen that the impedance Z greatly changes near the magnetic resonance frequency. That is, a maximum frequency of the complex magnetic permeability $\mu''$ is the magnetic resonance frequency. The impedance Z greatly changes at a frequency slightly lower than the magnetic resonance frequency, and the impedance Z first has an upward inflection point at a frequency A and then has a downward inflection point at a frequency B.

As can be seen from the graph shown in FIG. 9, the change in impedance is very great at both the frequencies A and B, and therefore the Q-value increases, so that the oscillator circuit easily satisfies the oscillation conditions and thus easily oscillates. When a filter constant is set according to an electrical part, either the maximum or minimum point of the impedance, the midpoint between the maximum and minimum points, a frequency under the maximum point and a frequency over the minimum point can be optionally selected as the oscillation conditions. In other words, when the conditions that oscillation takes place at the magnetic resonance frequency in a frequency range which reflects the change in the magnetic resonance frequency are set, it is easy to electrically detect the change in impedance near the magnetic resonance frequency as the change in the frequency.

More specifically, the change in impedance caused near the magnetic resonance frequency is a phenomenon which is caused by a change in complex magnetic permeability caused by a magnetic resonance phenomenon, and the frequency having the inflection point is typical of the magnetic resonance frequency in itself. A magnetic field to be detected causes a change in the magnetic resonance frequency, and moreover, this change causes a change in the frequencies A and B. Therefore, the oscillator circuit is configured so as to satisfy the oscillation conditions at the frequency A or B, and thus, with this configuration, a change in the magnetic field to be detected can be detected from a change in an oscillation frequency of the oscillator circuit.

Figure 10:
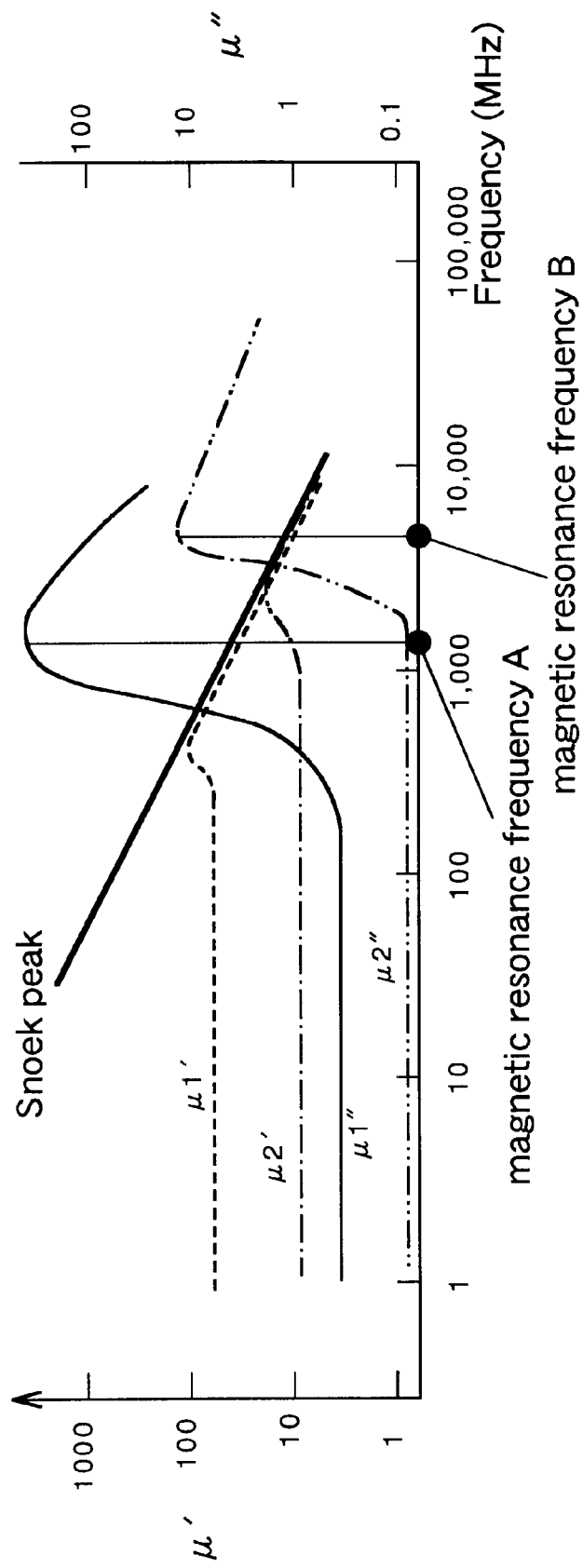
FIG. 10 is a graphical representation of the correlation between the magnetic resonance frequency and the complex magnetic permeability.

A graph shown in FIG. 10 shows the correlation between the magnetic resonance frequency and the complex magnetic permeability. The correlation between the magnetic resonance frequency and the complex magnetic permeability has been heretofore demonstrated by Snoek. Snoek has demonstrated that, in the same magnetic material, a decrease in the magnetic permeability (i.e., the complex magnetic permeability $\mu'$) causes an increase in the magnetic resonance frequency, while an increase in the magnetic permeability causes a decrease in the magnetic resonance frequency, and therefore both the magnetic permeability and the usable limit (i.e., the magnetic resonance frequency) of the magnetic material cannot be increased beyond the limit line. This means that a change in the magnetic resonance frequency caused by a magnetic field to be detected causes a change in the complex magnetic permeability.

Second Embodiment

Figure 11:
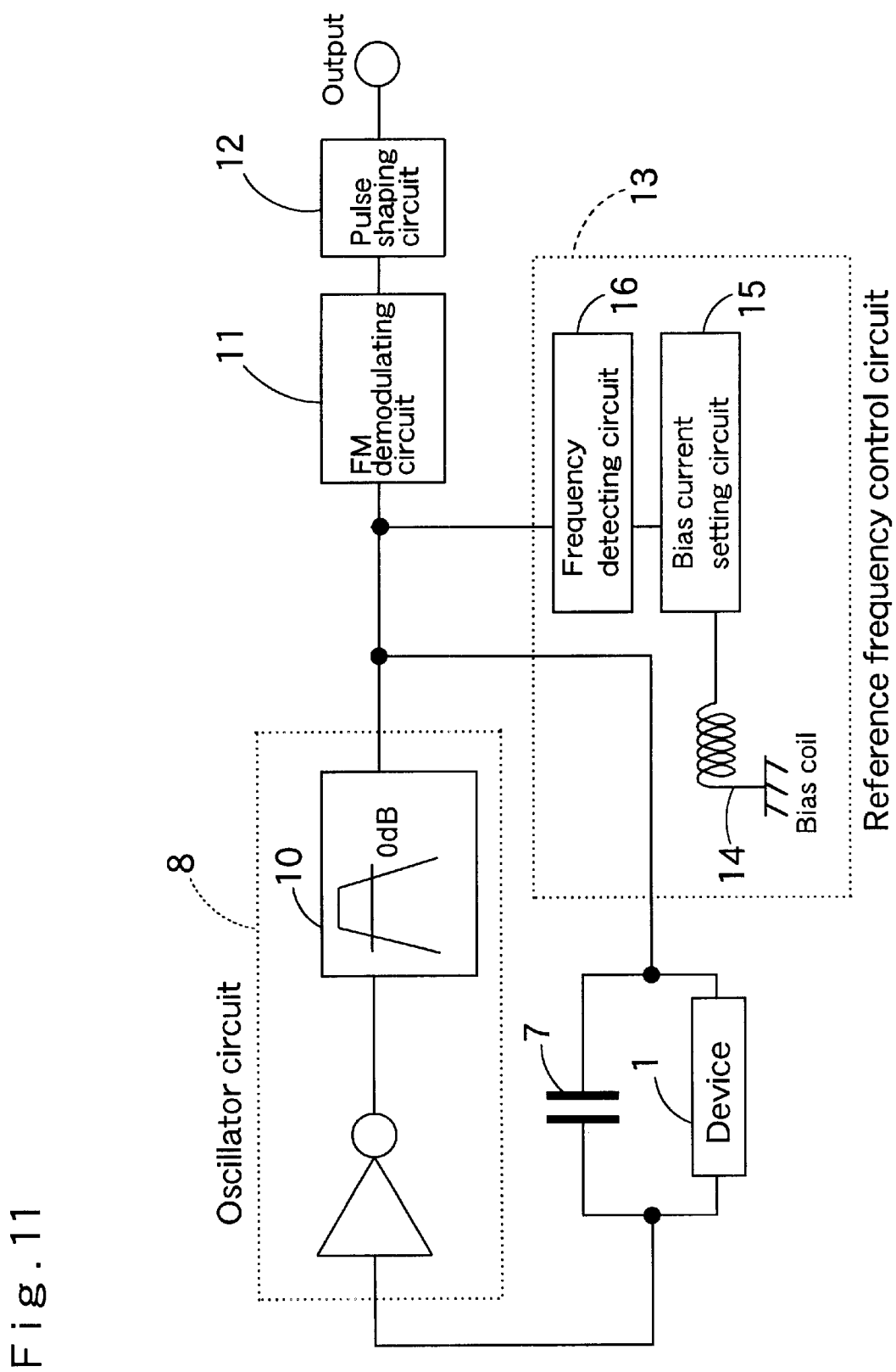
FIG. 11 is a block diagram of a detector circuit of a magnetic sensor device.

FIG. 11 shows a diagram of a configuration of a magnetic sensor device according to a second embodiment. A circuit of the second embodiment comprises the circuit of the first embodiment shown in FIG. 4, and a reference frequency control circuit 13 added to the circuit.

The reference frequency control circuit 13 is connected to the oscillator circuit 8 in order to previously offset an oscillation frequency of the oscillator circuit 8 from a natural magnetic resonance frequency to a high frequency and to keep the offset frequency constant. The oscillator circuit 8 whose oscillation frequency changes due to a change in a magnetic resonance frequency of the thin film magnetic sensor 1 caused by a change in a magnetic field to be detected, the FM demodulating circuit 11 for extracting as a baseband output only the amount of change in the oscillation frequency, namely, the amount of change in an external magnetic field, and the pulse shaping circuit 12 which converts a magnetic change into an electric signal that can be processed as digital data corresponding to bit data of north and south poles are the same as the above-described circuits 8, 11 and 12 shown in FIG. 4.

The reference frequency control circuit 13 comprises a frequency detecting circuit 16 which detects the oscillation frequency of the oscillator circuit 8, a bias coil 14 which generates a bias magnetic field, and a bias current control circuit 15 which controls a current to be supplied to the bias coil 14 in accordance with the detected oscillation frequency. The bias coil 14 generates the bias magnetic field because the previous application of the bias magnetic field is advantageous for stable detection of the magnetic fields of different polarities in the north and south directions and because the application of the bias magnetic field is effective at setting the oscillation frequency higher.

A center frequency of the oscillation frequency is herein called a reference frequency. The generation of the bias magnetic field by the bias coil 14 allows keeping the reference frequency constant and is thus effective at preventing a change in the oscillation frequency due to external factors, which include the influence of a temperature change and the so-called disturbance magnetic field such as geomagnetism other than a magnetic field to be detected upon magnetic permeability of a magnetic material or the like, a change in a gap between the magnetic sensor 1 and a magnetized storage medium, and so on.

In the reference frequency control circuit 13, the frequency detecting circuit 16 detects the oscillation frequency of the oscillator circuit 8, and the bias current control circuit 15 performs feedback control on a bias current so that the average oscillation frequency may be higher than a preset magnetic resonance frequency, then applies the bias current containing a DC component to the bias coil 14 and thus controls the current of the bias coil 14 so as to keep the oscillation frequency at the higher frequency.

Figure 12:
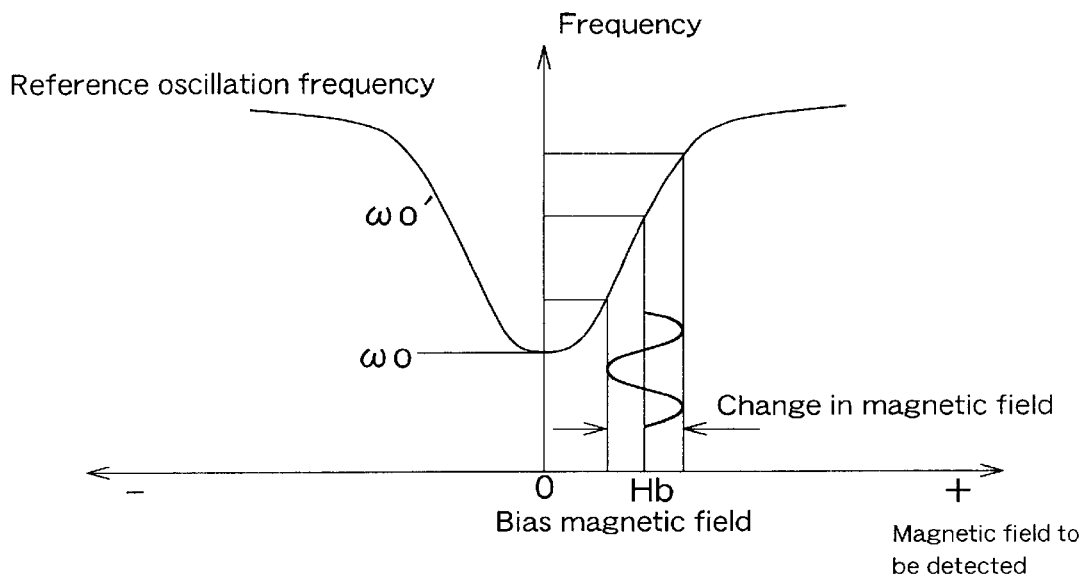
FIG. 12 is a graphical representation of the correlation between the magnetic field to be detected and the magnetic resonance frequency.

FIG. 12 shows a graphical representation of the correlation between the applied bias magnetic field and the magnetic resonance frequency. A magnetostatic field such as geomagnetism occurs in nature, and the magnetostatic field functions in the same manner as a bias magnetic field Hb. Therefore, a magnetic field must be generated by a coil or a magnet in order to set the bias magnetic field with stability.

As shown in FIG. 12, the application of the bias magnetic field to the thin film magnetic sensor 1 allows detecting the maximum point of a frequency change caused by a magnetic field to be detected (i.e., a magnetic storage pattern) and thereby increasing sensitivity, and therefore permits offsetting the magnetic field so that a change in the magnetic field to be detected can reflect a frequency increase or decrease. Moreover, the application of the bias magnetic field allows setting the oscillation frequency of the oscillator circuit 8 higher than the natural magnetic resonance frequency. Accordingly, the bias magnetic field enables stable detection of the north or south pole of the magnetic field to be detected (i.e., the magnetic storage pattern) as an increase or decrease in frequency relative to the reference frequency.

Figure 13:
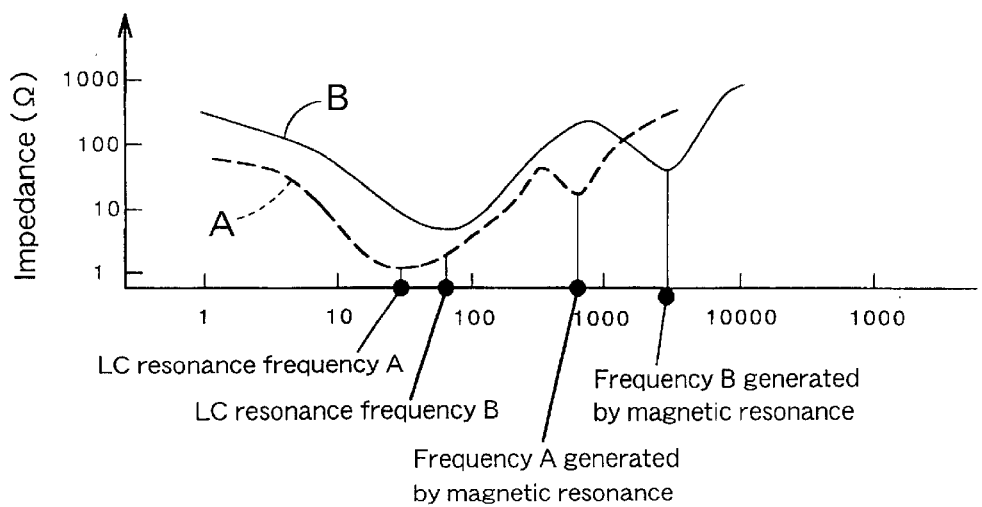
FIG. 13 is a graphical representation of the correlation between the frequency and an impedance Z.

FIG. 13 shows a graphical representation of the correlation between the oscillation frequency and the impedance Z. A dotted line A shows the correlation therebetween in the presence of the magnetic field to be detected, and a solid line B shows the correlation therebetween in the absence of the magnetic field to be detected. From the dotted line A and the solid line B in FIG. 13, it can be seen that the magnetic field to be detected first causes a change in $\mu$ value and thus causes the impedance to have inflection points near an LC resonance frequency and a magnetic resonance frequency generated by an inductance component and an interposed capacitance component on both the ends of the conductor. When using high frequencies, the capacitor C connected in parallel to both ends of the thin film magnetic sensor 1 eliminates the influence of a parasitic capacitance component because the parasitic capacitance component exists in the magnetic sensor.

Due to the influence of the magnetic field to be detected, an LC resonance frequency A1 under no magnetic field to be detected changes to an LC resonance frequency B1 through the application of the magnetic field. Similarly, a frequency A2 that is an inflection point generated by magnetic resonance changes to a frequency B2 generated by magnetic resonance similarly to the frequency A2. As described above, it can be seen from a graph shown in FIG. 13 that a change in the magnetic field to be detected (i.e., the magnetic storage pattern) can be detected as a frequency change.

A frequency change caused by LC resonance is a frequency change which is used to detect an inductance change caused by an MI device of the prior art by using an oscillation frequency. Even a method of detecting the inductance change by using the oscillation frequency allows detecting a change in a magnetic field to be detected as a frequency change. However, a method using a change in $\mu$ value as a frequency change has a disadvantage of having a less frequency change caused by the magnetic field to be detected and thus having lower sensitivity to detect the magnetic field, as compared to a method of detecting a magnetic resonance frequency.

The correlation among an LC resonance frequency fLc, a magnetic resonance frequency fr, an inductance L and magnetic permeability $\mu'$ is expressed by the following equation:

$$fLC (1/\sqrt{L})(1/\sqrt{\mu}) \sqrt{fr}$$

where fr denotes the magnetic resonance frequency. From the above equation, it can be seen that, as is well known, the LC resonance frequency fLc is correlated with the inductance L, and the inductance L is proportional to the $\mu$ value of the magnetic permeability (i.e., the real part $\mu'$) and is consequently proportional to the one-half power of the magnetic resonance frequency fr, as demonstrated by Snoek. In the method of directly detecting the magnetic resonance frequency, the inductance L is, of course, proportional to the first power of the magnetic resonance frequency fr, and therefore the method of detecting the $\mu$ value of the magnetic permeability by using the frequency change caused by LC resonance has poor sensitivity, as compared to the method of directly detecting the magnetic resonance frequency. The magnetic sensor device of the present invention is a device which detects a change in itself in the magnetic resonance frequency so as to detect the magnetic field to be detected, as distinct from a general device which detects a change in magnetic permeability by using an LC resonance frequency, and therefore the magnetic sensor device also has superior sensitivity as compared to the above-mentioned device.

Figure 14:
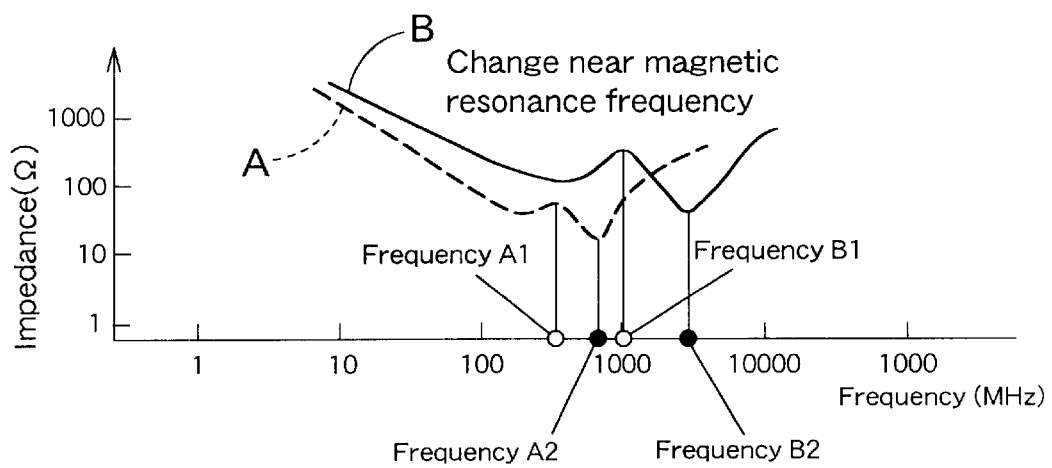
FIG. 14 is a graphical representation of the correlation between the frequency and the impedance Z, which occurs when a high-pass filter is added.

FIG. 14 shows a graph of a change in the impedance Z versus frequency, which occurs when a high-pass filter is added to the oscillator circuit. A dotted line A shows a change which occurs in the presence of the magnetic field to be detected, and a solid line B shows a change which occurs in the absence of the magnetic field to be detected. The oscillator circuit 8 of the magnetic sensor device must be configured so that its oscillation frequency may correlate with the magnetic resonance frequency and the oscillation conditions may hold at a frequency near the magnetic resonance frequency so as to cause a change in the magnetic field to be detected as a frequency change. According to the current technology of electronic circuit, it is feasible that the magnetic resonance frequency ranges from about 200 MHz to about 2 GHz inclusive, for example.

The high-pass filter is provided in the oscillator circuit 8, and thus the oscillation frequency conditions can be set to a frequency A1 or A2 shown in FIG. 14. The oscillator circuit 8 oscillates by the passage of an alternating current through the thin film magnetic sensor 1. The oscillation conditions are determined by conditions of frequencies at which the impedance Z has inflection points. Therefore, it is necessary to prevent other conditions in order that the oscillator circuit 8 may oscillate at the magnetic resonance frequency of the magnetic film 2 of the thin film magnetic sensor 1.

In order to prevent the oscillator circuit 8 from oscillating by means of an inductance component and a parasitic capacitance of the magnetic film 2, the capacitor C is interposed so as to reduce frequencies of the oscillation conditions, namely, the so-called LC oscillation conditions and thereby increase a difference between the oscillation conditions and the conditions of oscillation using the natural magnetic resonance frequency. With this arrangement, a filter or the like is used to facilitate oscillation using the magnetic resonance frequency and to perform filtering and feedback so as to prevent the oscillation conditions from holding at other frequencies. When the magnetic field to be detected causes a change in the magnetic resonance frequency of the thin film magnetic sensor 1, the magnetic permeability increases and the impedance Z decreases to a minimum value near the magnetic resonance frequency. Although the conditions of LC oscillation have lower frequencies and lower impedances, the filter is used to perform separation and thereby enable oscillation using the magnetic resonance frequency.

The application of the magnetic field to be detected to the thin film magnetic sensor 1 causes the impedance Z to change from the dotted line A to the solid line B, and causes the frequencies A1 and A2 corresponding to the magnetic resonance frequency to change to frequencies B1 and B2, respectively. The impedance Z has an upper inflection point at the frequency A1, and the impedance Z has a lower inflection point at the frequency A2. It is possible that some electronic circuits oscillate at the frequencies A and B.

For example, a feedback oscillator circuit using the filter 10 is shown in FIG. 11. The filter 10 is interposed in the oscillator circuit, thereby making it feasible to actually or apparently increase impedances of frequencies lower than high frequencies to be detected in order to select the the frequencies. The interposed filter 10 may be a band-pass filter, or the filter 10 may be a low-pass filter because a circuit containing an inductance component increases naturally in impedance as a frequency increases. Other oscillator circuits include a plurality of specific feasible circuits, such as a reflex oscillator circuit.

Figure 15:
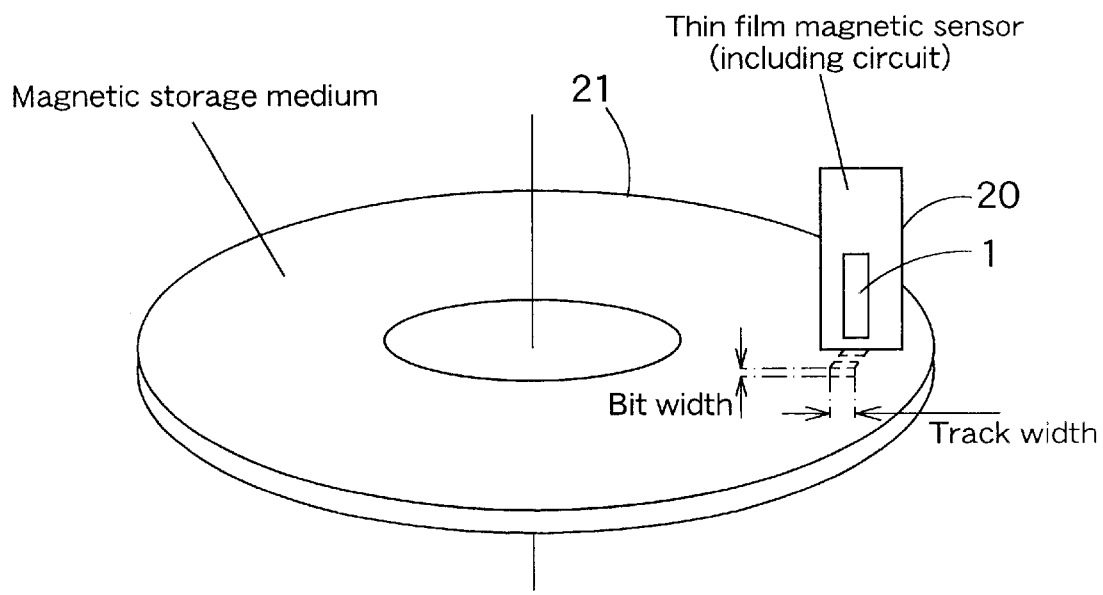
FIG. 15 is a layout illustration of a magnetic storage medium and the thin film magnetic sensor.

FIG. 15 shows a diagrammatic illustration of the thin film magnetic sensor 1 of the magnetic sensor device mounted to a magnetic head 20 of a magnetic disk unit and a magnetic storage medium 21 such as a hard disk, showing how a magnetic storage pattern is read out from the magnetic storage medium 21 by using the thin film magnetic sensor 1.

The magnetic storage medium 21 is rotated at high speed, thus its minute storage area rotates relative to the thin film magnetic sensor 1, and this rotation causes a rapid change in a magnetic field of the magnetic sensor 1, which then detects a magnetic pole of the storage area. The magnetic sensor device of the present invention can read out a magnetic pattern in the storage area at a rate of 200 Mbit/S or higher, for example.

Figure 16:
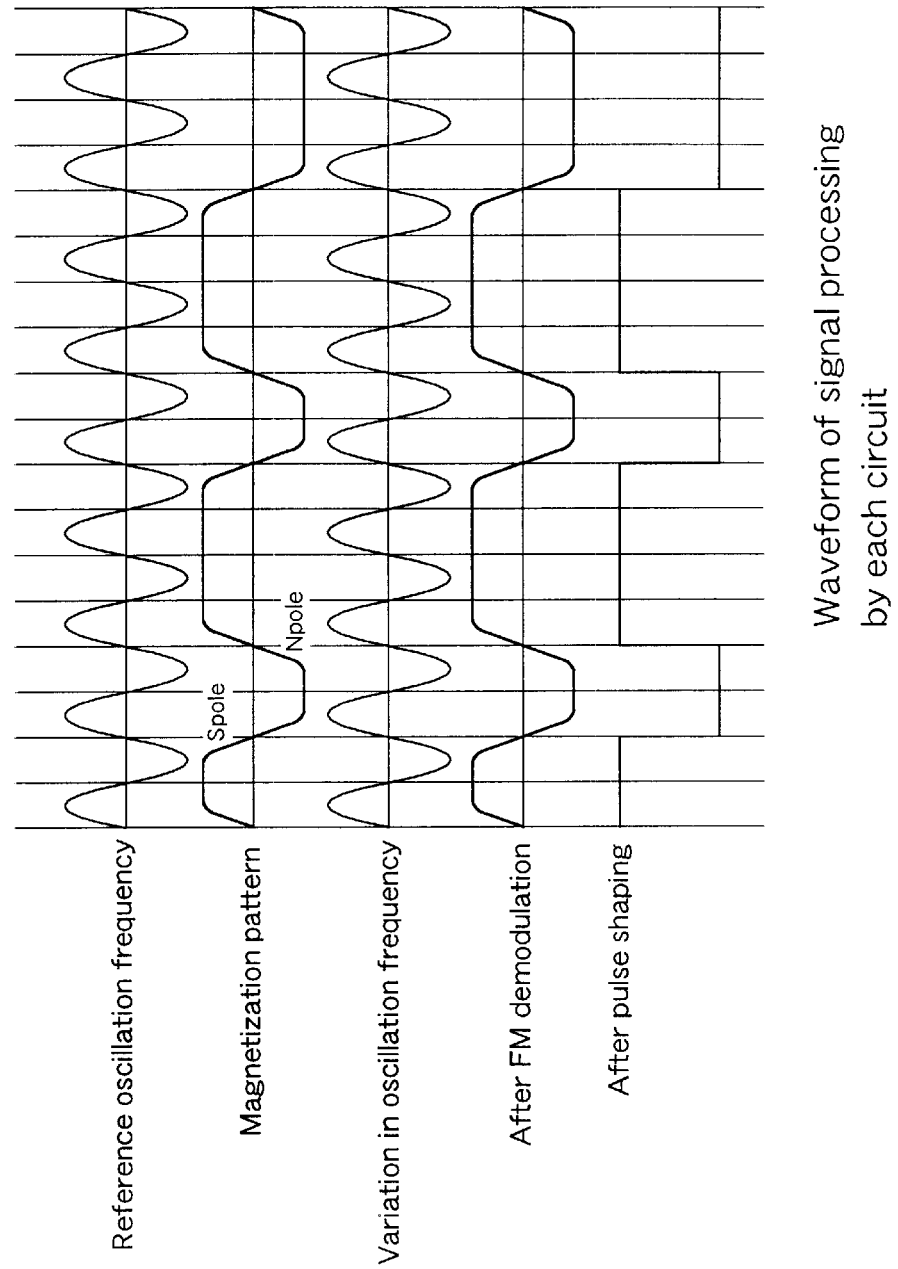
FIG. 16 is a waveform chart of parts of the detector circuit.

FIG. 16 shows a waveform of a reference oscillation frequency, a waveform of a magnetic pattern, a waveform of a varied oscillation frequency, an output waveform of the FM demodulating circuit 11 and an output waveform of the pulse shaping circuit 12. The oscillation frequency of the oscillator circuit 8 detects the magnetic field of the magnetic pattern of the magnetic storage medium 21 and thus causes an increase or decrease in the oscillation frequency. The bias magnetic field is now set so that the south pole of the storage medium may cause a decrease in the oscillation frequency and the north pole thereof may cause an increase in the oscillation frequency.

The reference oscillation frequency of the oscillator circuit 8 is controlled by the reference frequency control circuit 13 so as to change to a predetermined frequency. More specifically, the bias coil 14 applies the bias magnetic field so as to perform feedback control on the oscillation frequency so that the center of a change in the oscillation frequency changes to a set reference frequency. In this state, the magnetic pattern of the magnetized magnetic storage medium 21 moves relative to the thin film magnetic sensor 1 at high speed, and this movement causes a change in the oscillation frequency of the oscillator circuit 8. A lower portion of the magnetic pattern shown in FIG. 16 indicates the south pole, which causes a decrease in the oscillation frequency, and an upper portion of the magnetic pattern indicates the north pole, which causes an increase in the oscillation frequency.

The change in the oscillation frequency of the oscillator circuit 8 is demodulated by the FM demodulating circuit 11, which then outputs a signal indicative of the magnetic pattern. Then, the output signal from the FM demodulating circuit 11 is transmitted to the pulse shaping circuit 12, which then outputs the waveform-shaped signal in order to process the signal as a digital signal for use in a computer or the like.

As shown in FIG. 16, the detection of the magnetic storage pattern of the magnetic storage medium 21 at a rate of, for example, 200 Mbit/S requires the oscillator circuit 8 to have a reference oscillation frequency of 200 MHz, which is good enough for the detection. Since one cycle of the reference oscillation frequency corresponds to the reading of data magnetized with a bit width on the magnetic storage medium 21, a piece of data can be determined in one cycle, and this is very easy for signal processing. For example, which magnetic pole is generated by magnetization can be also determined in a half cycle, and it is therefore easy to read data at, at least, a rate 2 times the oscillation frequency, that is, a rate of 400 Mbit/S.

Moreover, the bias magnetic field can be changed according to the rpm of the magnetic storage medium 21 so as to make a read rate variable. This means that the reading is possible even before the rpm of the magnetic storage medium 21 reaches steady operation, and therefore the total read time can be reduced.

Figure 17:
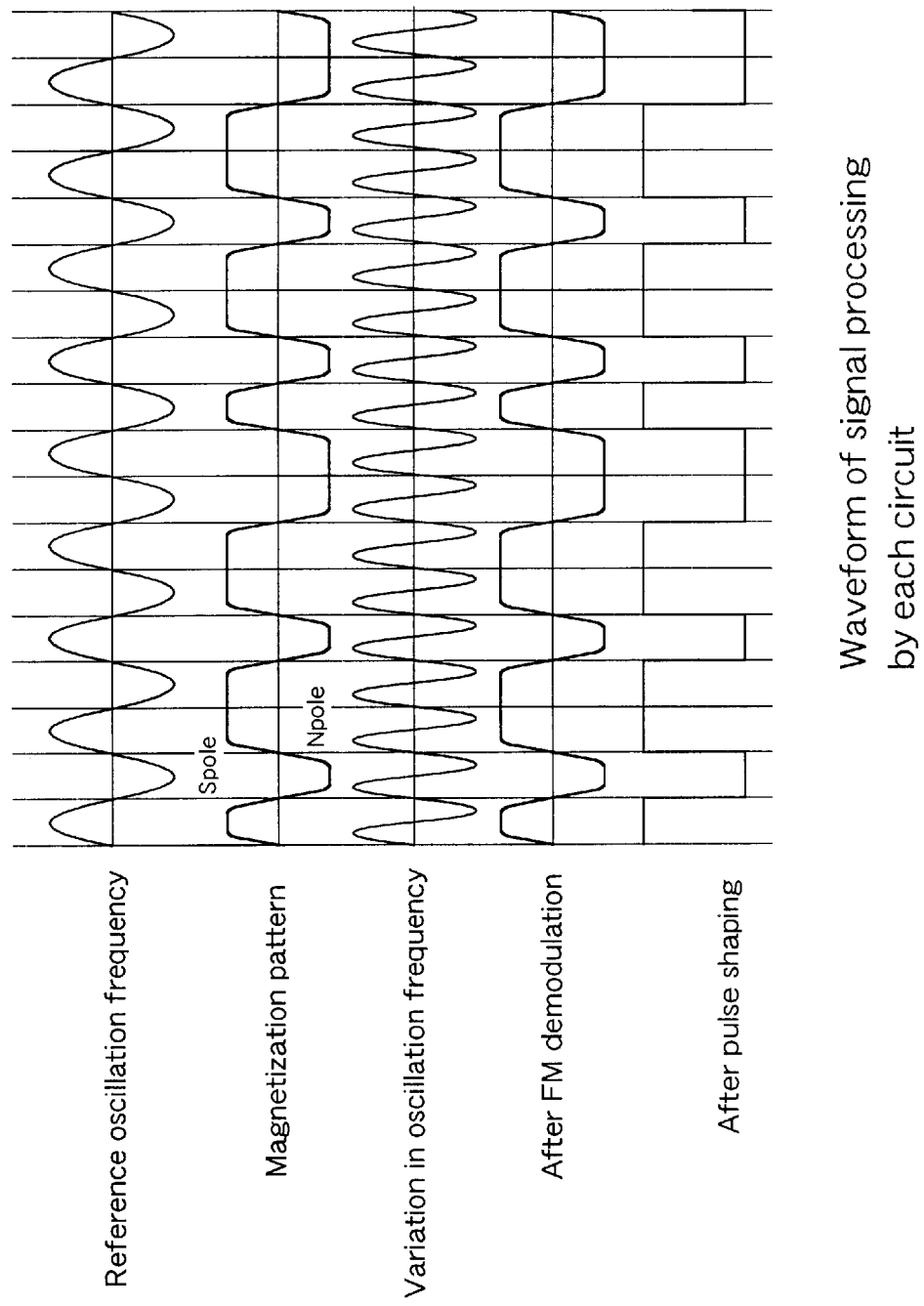
FIG. 17 is a waveform chart of the parts of the detector circuit.

A waveform chart shown in FIG. 17 shows signal waveforms of the circuits, which are generated when the magnetic pattern is read out at a rate 2 times the reference oscillation frequency. If the reference oscillation frequency is set to, for example, 200 MHz, a readable rate is therefore at least 200 Mbit/S, and a double speed is also possible. As described above, the magnetic sensor device of the present invention can read stored data from the magnetic storage medium such as the magnetic disk at very high speed.

[Manufacture of Thin Film Magnetic Sensor]

Next, the description is given with regard to the manufacture of the thin film magnetic sensor 1. For microfabrication of the thin film magnetic sensor 1, it is effective to use a thin film manufacturing process which is currently used to manufacture a magnetic head for use in an HDD (a hard disk drive), such as a GMR element. As the thin film manufacturing technology, the technology such as photolithography has established the technology such as etching, which facilitates microfabrication. As described above, the magnetic sensor device of the present invention detects a change in the magnetic resonance frequency of the magnetic material as a change in electrical impedance.

Accordingly, a thin film structure has to be a structure such that a change in magnetic permeability of the magnetic material has a great influence upon the electrical impedance, and therefore the thin film structure is a stacked structure comprising the conductor and the magnetic material for detecting the electrical impedance. Moreover, the conductor needs a structure having a larger surface area, because it is necessary to prevent an impedance loss at high frequencies. The thin film structure ensures that the surface area of the conductor is larger than a cross-sectional area of a current path, and also in this sense, the thin film structure is effective.

For higher frequencies, there is a need for electrical insulation between the conductor and the magnetic material, or the same effect as the insulation, more specifically, the effect that the volume resistivity of the magnetic material is higher than that of the conductor so that a current generated by the skin effect is negligible even after allowing for the skin effect caused by high frequencies upon the magnetic material. The reason is as follows. When the magnetic material and the conductor are electrically continuous, high frequencies cause the skin effect to cause the passage of a larger amount of current through the magnetic material, as compared to low frequencies, and as a consequence, a smaller amount of current passes through the conductor. It is possible that this results from an increase in parasitic impedance in parallel with impedance of the conductor, and this leads to an increase in a loss component at high frequencies.

[Basic Structure of Thin Film Magnetic Sensor]

The magnetic film 2 whose magnetic resonance frequency is changed by a magnetic field to be detected has to have a magnetic resonance frequency of 200 MHz or higher, for instance. Therefore, the magnetic film 2 is made of a soft magnetic film for high frequencies, which produces little loss at up to very high frequencies, and a structure of the magnetic film 2 may be made of a single-layer magnetic film or a multilayer magnetic film. The techniques of providing the magnetic film 2 with a higher magnetic resonance frequency, while keeping the magnetic film 2 having soft magnetic properties at up to higher frequencies include the technique of making a magnetic film ultra-soft magnetic, such as the technique of providing a magnetic film with uniaxial magnetic anisotropy by matching the spin directions in a magnetic domain structure by providing the magnetic film with magnetic anisotropy.

[Single-layer Magnetic Film]

The single-layer magnetic film needs to have a higher magnetic resonance frequency of 200 MHz or higher, for example. A material of the single-layer magnetic film is basically required to have relatively high magnetic permeability and resistivity even at high frequencies. An amorphous thin film, a particulate thin film, a granular thin film or the like can be used as the material.

The amorphous thin film is generally formed in the following manner: an amorphous-state thin film is formed through deposition of Fe or Co by means of sputtering. Of the amorphous thin films, thin films which exhibit soft magnetic properties in particular, e.g., many soft magnetic thin films such as FeSiB, CoZrTz and CoNbZr, have been discovered. Materials, which have features of having a low magnetostrictive constant and high magnetic permeability through appropriate selection of the concentrations and types of additives, can be found as materials of the soft magnetic thin films. An amorphous material has high resistivity, which is a few tens of times copper's resistivity that is generally about 130 $\mu\Omega$.cm.

The particulate thin film exhibits very excellent soft magnetic properties, because a significant reduction in size of particles of the magnetic material to about 20 nm or less yields a weak magnetic bond between crystals or between particles. Recently, a particulate thin film having relative permeability in excess of 1000 in a band of higher frequencies of a few hundreds of MHz or higher has been discovered. A material of the particles contains about the same elements as an amorphous magnetic material contains, and the percentage of content of each element is also substantially the same.

The granular thin film has a structure in which ferromagnetic particles are appropriately spaced and isolated from one another and are thus uniformly dispersed in a nonmagnetic matrix in order to provide a weaker magnetic bond between particles of the particulate thin film. The ferromagnetic particles can be made of any of the following general soft magnetic materials. The general soft magnetic materials include: (1) soft magnetic metals such as iron (Fe) and nickel (Ni); (2) soft magnetic alloys, e.g., (i) Fe-based alloy (Fe—T.M.), (ii) Permalloy (Ni—Fe), (iii) Hard Permalloy (Ni—

Fe: Nb, Mo), (iv) sendust (Fe—Si—Al), (v) Softmax ((Fe:Ru)—Si—Ga), and (vi) Fe—Al based alloy (Fe—Al—T.M.); (3) amorphous metals; and (4) ferrite. Nonmagnetic materials include a nitrogen-added material, an oxygen-added material, an $SiO_2$-added material, and so forth.

[Multilayer Magnetic Film]

The multilayer magnetic film has a stacked structure comprising a magnetic material alternating with a nonmagnetic material. Although the magnetic material may be made of the particulate thin film, the granular thin film or the like, the magnetic material may be, of course, made of a simple magnetic film which does not have the complicated structures of the above-mentioned films. The nonmagnetic material may be made of a metal having no magnetic properties, an insulating film such as $SiO_2$, or the like. The multilayer magnetic film realizes ultra-soft magnetic properties, similarly to the granular thin film and the like.

[Ultra-soft Magnetizing]

Figure 18:
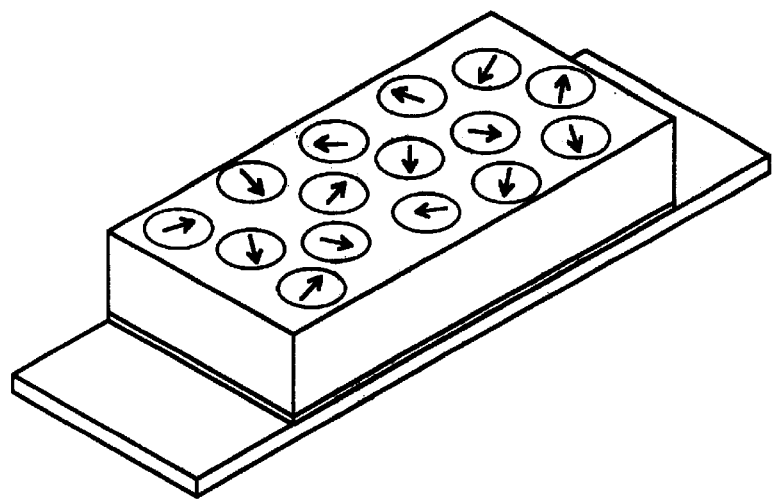
FIG. 18 is a diagrammatic illustration of a granular structure film.
Figure 19:
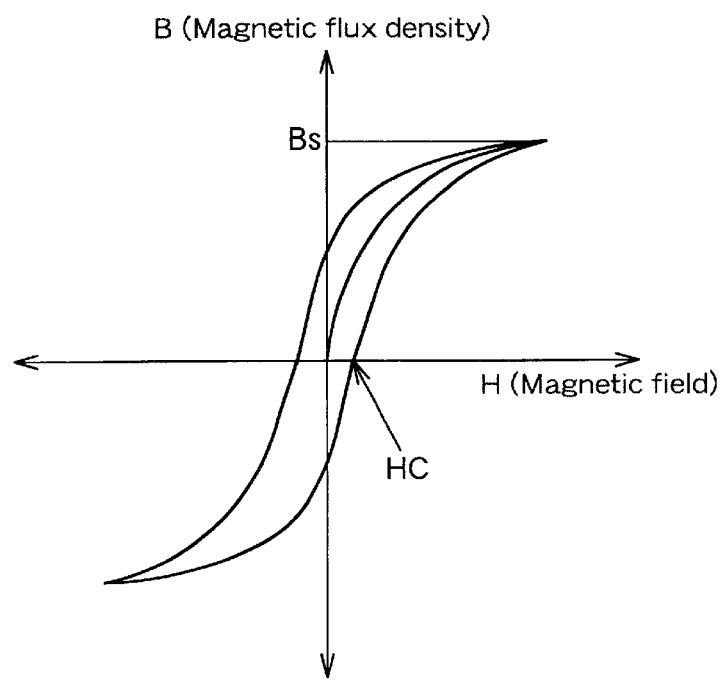
FIG. 19 shows a B-H curve at high frequencies.

The techniques of providing a magnetic film with a higher magnetic resonance frequency, while keeping the magnetic film having soft magnetic properties at up to higher frequencies include the technique of extremely reducing a magnetic bond between magnetic particles, typified by the granular thin film. FIG. 18 shows the thin film magnetic sensor 1 formed by using a granular structure film. In the granular structure film, magnetic particles are magnetically shielded from one another by a diamagnetic matrix, so that the particles have a lower coercive force Hc. As shown in FIG. 19, the coercive force Hc can be extremely reduced in order to reduce a hysteresis loss of a B-H curve at high frequencies.

FIGS. 20A to 20C show magnetic domain structures of a multilayer film having an inserted nonmagnetic film. Desirably, the soft magnetic material, which exhibits high magnetic permeability at high frequency bands, has the magnetic domain structure shown in FIG. 20A. However, when all magnetizations are oriented in the same direction, spontaneous magnetization takes place, and therefore the structure shown in FIG. 20A is unstable in energy. Therefore, the magnetic film actually has the thermodynamically stable magnetic domain structure shown in FIG. 20B. More specifically, the magnetic film has not only a 180-degree magnetic domain but also a reflux magnetic domain (a triangular magnetic domain) which refluxes magnetization to reduce magnetostatic energy so that spontaneous magnetization cannot take place.

A multilayer film having an inserted nonmagnetic material is effective as a method of preventing the reflux magnetic domain from generating. Since magnetostatic bonding occurs on ends of magnetic films between the magnetic films separated by a thin nonmagnetic film, magnetization is refluxed between the magnetic films, and this prevents the generation of the free magnetic poles or the reflux magnetic domain. Therefore, the magnetic domain structure is dominated by a 180-degree magnetic domain wall as shown in FIG. 20C. The structure causes little shift of the magnetic domain wall and thus causes little loss at up to high frequencies. The multilayer film having the inserted nonmagnetic film can constitute a thin film magnetic sensor capable of detecting up to high frequencies. It is general that, if a plurality of magnetic layers are not provided, the magnetization vector generates the magnetic poles and therefore a stable magnetic domain structure cannot be formed.

The thin multilayer film has the effect of preventing the spin in the direction perpendicular to the film by causing the spin direction to lie in a film surface. This means that a decrease in the degree of freedom of the spin direction leads to an increase in magnetic permeability. This can be easily understood by discussing the fact that an alternating field rotates more spins.

Figure 21:
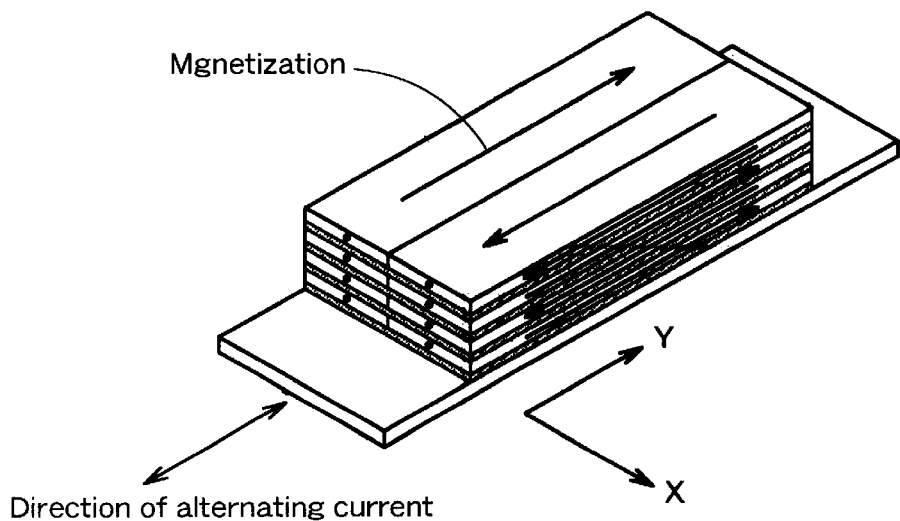
FIG. 21 is an illustration of uniaxial magnetic anisotropy.
Figure 22:
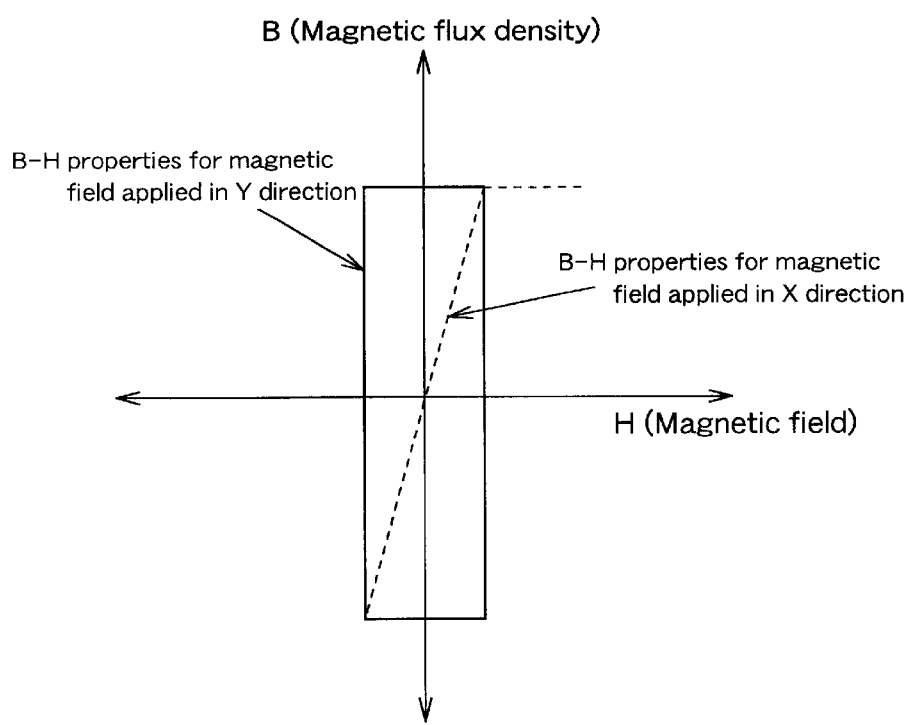
FIG. 22 is a graphical representation of B-H properties.

The techniques of providing a magnetic film with soft magnetic properties at up to higher frequencies include the technique of applying uniaxial magnetic anisotropy in the same direction as the direction of current. In the case of the thin film magnetic sensor of the present invention, the uniaxial magnetic anisotropy is applied in parallel in the direction of passing current, that is, in the Y direction shown in FIG. 21. Thus, the B-H curve is rectangular in the Y direction as shown in FIG. 22, but the B-H curve exhibits very excellent soft magnetic properties in the X direction perpendicular to the Y-axis which indicates the direction of magnetic field generated by the current, as shown by a diagonal line connecting the vertices of the rectangle illustrated in FIG. 22.

Method of realizing soft magnetic properties include a method of making a coercive force as low as possible, such as the granular structure film, and a method which utilizes a phenomenon in which excellent soft magnetic properties are exhibited in the direction perpendicular to the spin direction by matching the spin directions through the use of magnetic anisotropy. This means that, even if the magnetic film is made of a material that is not excellent in soft magnetic properties, the material can function as a soft magnetic material by applying uniaxial magnetic anisotropy by means of magnetic heat treatment or magnetic annealing. Of course, the multilayer film may be used in combination with the application of magnetic anisotropy as shown in FIG. 21, or a magnetic film having the granular structure may used as the magnetic material of the multilayer film.

Therefore, a method of setting frequencies to be detected is required to select the material of the magnetic material, the structure of the multilayer film or the like, the magnetic domain structure formed by uniaxial magnetic anisotropy, and so forth. The reason is as follows. Since too high a frequency makes it difficult to manufacture the circuit, it is necessary to appropriately set the magnetic resonance frequency of the magnetic material in consideration of the size of the storage area of the magnetic storage medium to be detected and the frequency.

FIRST EXAMPLE

Figure 23:
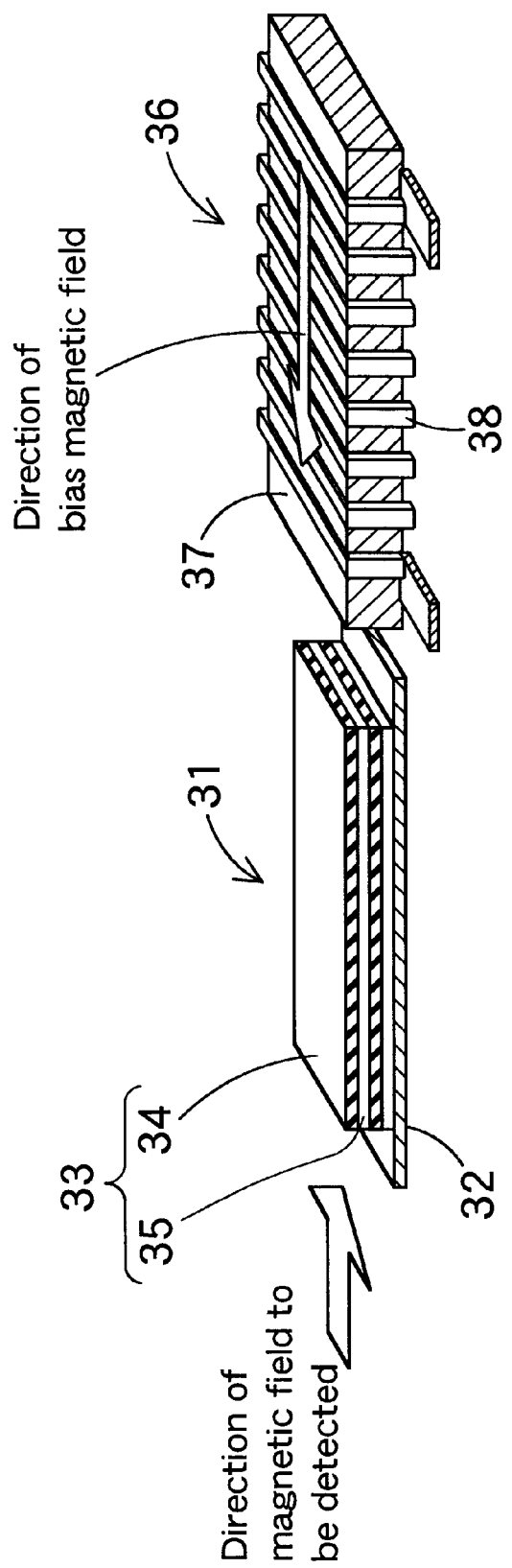
FIG. 23 is a perspective view of a thin film magnetic sensor and a bias magnetic field generator device according to a first example.

Next, the description is given with regard to more specific examples of the magnetic sensor device. FIG. 23 shows a structure of a thin film magnetic sensor 31, and a bias magnetic field generator device 36 which applies a bias magnetic field to the sensor 31. The thin film magnetic sensor 31 has a structure comprising a conductive layer 32 made of Cu, Al or the like of about 0.5 $\mu$m thick, and a multilayer magnetic film 33 formed on the conductive layer 32 by means of deposition or the like. The magnetic film 33 has a stacked structure comprising an insulating layer 35 of about 0.1 $\mu$m thick, and a magnetic layer 34 made of Co or the like of about 0.1 m thick.

The bias magnetic field generator device 36 comprises a core 37 and a coil 38 wound around the core 37. The core 37 is formed by shaping a thin film made of a magnetic material such as Co into a minute rectangular thin film, and the coil 38 wound around the core 37 is made of a thin film conductor. As described above, the bias magnetic field generator device 36 is made of the thin films, and therefore the device 36 can be manufactured by the same process as the process of manufacturing the thin film magnetic sensor 31.

As shown in FIG. 23, the bias magnetic field generator device 36 is located adjacent to and facing the side of the thin film magnetic sensor 31 so as to apply a magnetic field in the same direction as the direction of a magnetic field to be detected to the thin film magnetic sensor 31 from the side opposite to the sensor 31. Although not shown in FIG. 23, the oscillator circuit shown in FIG. 11 is connected to the thin film magnetic sensor 31, and the bias current control circuit is connected to the bias magnetic field generator device 36.

During operation, the bias magnetic field generator device 36 feeds a current through the coil 38 and thus generates a bias magnetic field in the direction indicated by the arrow in FIG. 23 (i.e., toward the sensor 31). Thus, the oscillation frequency of the oscillator circuit is stably kept higher than the natural magnetic resonance frequency of the magnetic film. Then, a change in the magnetic field to be detected causes a change in magnetic properties of the thin film magnetic sensor 31 near the magnetic resonance frequency, and this change causes a change in the oscillation frequency of the oscillator circuit, which then outputs the change in the magnetic field to be detected as the change in the oscillation frequency.

SECOND EXAMPLE

Figure 24:
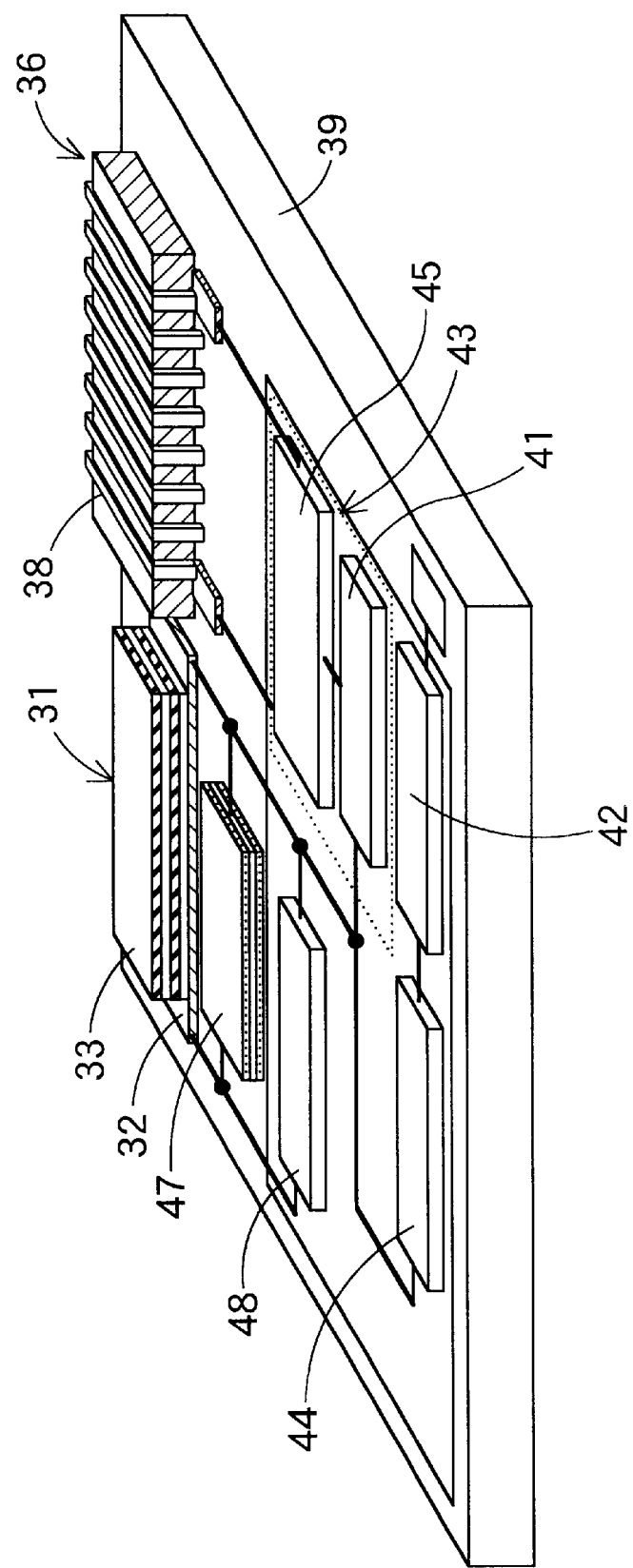
FIG. 24 is a perspective view of a magnetic sensor device according to a second example.

FIG. 24 shows a magnetic sensor device of a second example. In the second example, the above-described bias magnetic field generator device 36 and thin film magnetic sensor 31 are formed on the same semiconductor substrate (a silicon wafer) 39. A capacitor 47 to be connected to the thin film magnetic sensor 31, an oscillator circuit 48, and a reference frequency control circuit 43 to be connected to the bias magnetic field generator device 36 are also formed on the same semiconductor substrate 39. An FM demodulating circuit 44 to be connected to an output of the oscillator circuit 48, a pulse shaping circuit 42 to be connected to an output side of the FM demodulating circuit 44, and a bias current control circuit 45 which detects the frequency of the oscillator circuit 48 through a frequency detector current 41 and controls the bias magnetic field generator device 36 are also formed on the same semiconductor substrate 39. The devices and the circuits are connected through a conductive layer formed on the semiconductor substrate 39. As described above, the devices and the circuits can be integrated on the semiconductor substrate as an on-chip structure, and this structure permits a small-sized device and also facilitates the connection between the devices and the circuits. Moreover, this structure allows reducing a connection length between the devices and the circuits, thus allows reducing a parasitic impedance such as a stray capacitance or an inductance between lines, thus allows reducing a desired loss incident to high frequencies, and therefore allows detecting magnetism generated by higher frequencies of 200 MHz or higher, for example.

THIRD EXAMPLE

Figure 25:
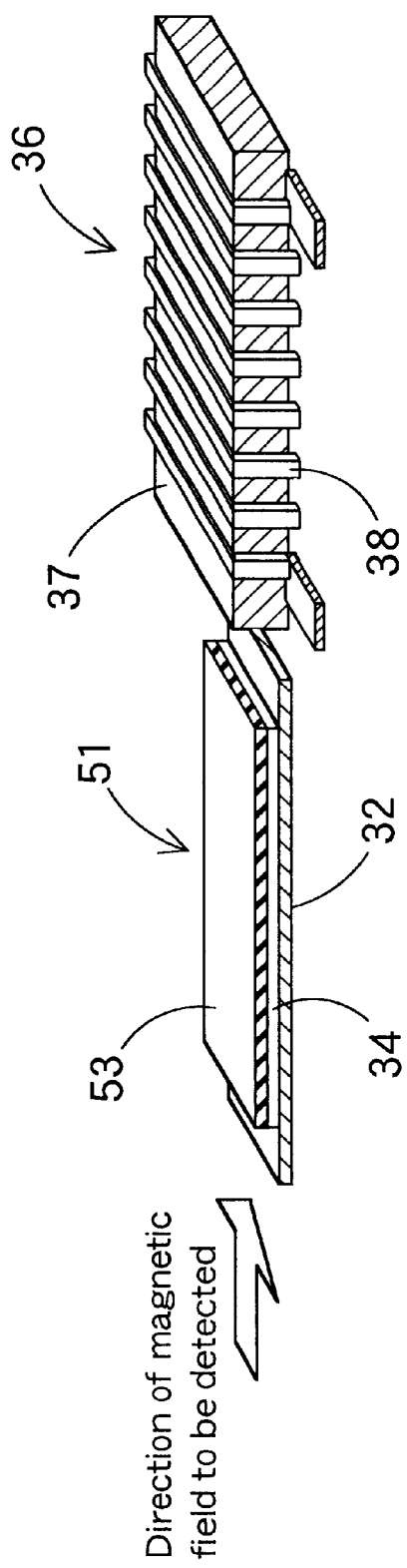
FIG. 25 is a perspective view of a thin film magnetic sensor and a bias magnetic field generator device according to a third example.

FIG. 25 shows a magnetic sensor device of a third example. In the third example, a magnetic film 53 of a thin film magnetic sensor 51 is made to be a single-layer film, and the magnetic film 53 is mounted on a conductive layer 32 with an insulating layer 34 in between. As described above, a multilayer magnetic film can reduce a loss incident to high frequencies, but the single-layer magnetic film 53 can be used as long as the magnetic film can have a high magnetic resonance frequency through appropriate selection of a material of the magnetic film.

FOURTH EXAMPLE

Figure 26:
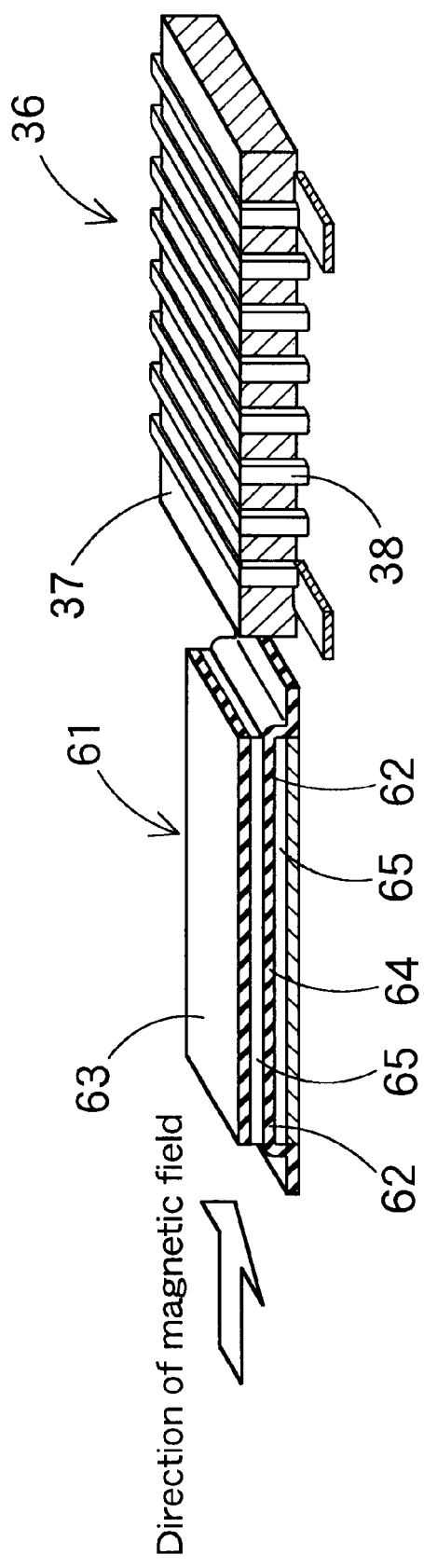
FIG. 26 is a perspective view of a thin film magnetic sensor and a bias magnetic field generator device according to a fourth example.

FIG. 26 shows a magnetic sensor device of a fourth example. In the fourth example, a thin film magnetic sensor 51 has a structure in which a conductive layer 62 is sandwiched between insulating layers 65 and a magnetic film 63 is formed on a conductive layer 62 with the insulating layer 65 in between. This structure allows increasing the ratio of a reactance component of the magnetic sensor to a parasitic impedance, thereby making it easy that the oscillation conditions of the oscillator circuit hold.

FIFTH EXAMPLE

Figure 27:
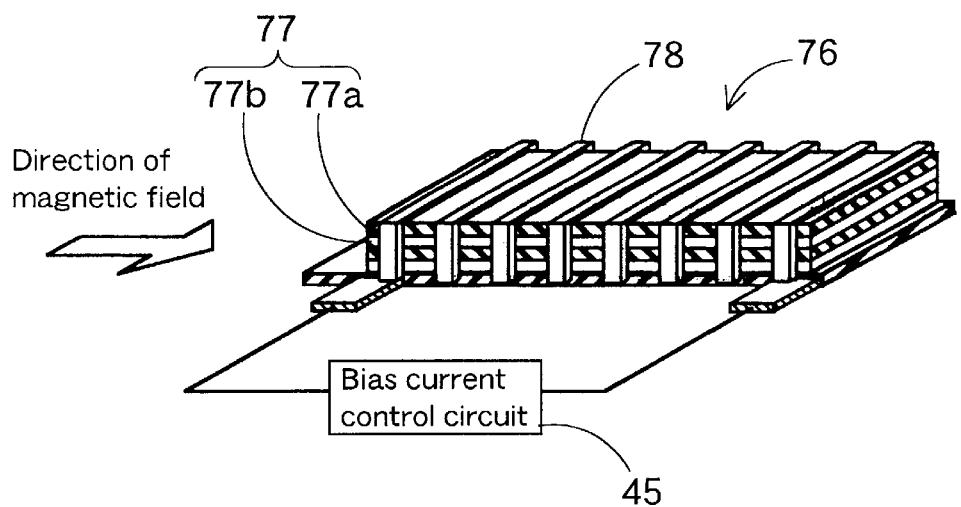
FIG. 27 is a perspective view of a bias magnetic field generator device according to a fifth example.

FIG. 27 shows a bias magnetic field generator device 76 of a magnetic sensor device of a fifth example. The bias magnetic field generator device 76 comprises a core 77 and a coil 78 wound around the core 77. The core 77 has a stacked structure comprising a magnetic layer 77a and an insulating layer 77b. The core 77 having the stacked structure allows generating a large amount of bias magnetic field, and therefore allows reducing the size of the bias magnetic field generator device 76.

SIXTH EXAMPLE

Figure 28:
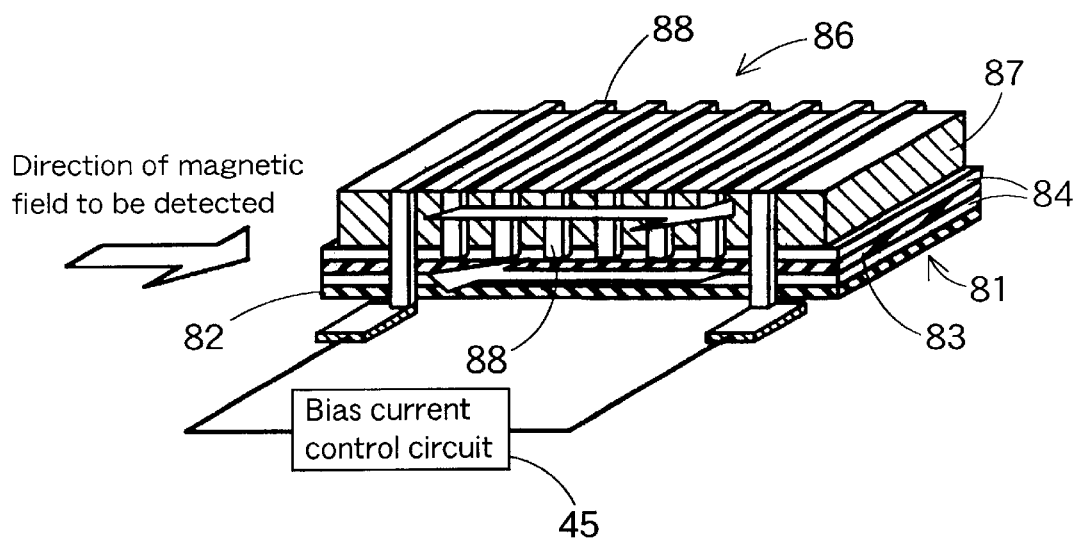
FIG. 28 is a perspective view of a bias magnetic field generator device according to a sixth example.

FIG. 28 shows a bias magnetic field generator device 86 of a magnetic sensor device of a sixth example. The bias magnetic field generator device 86 comprises a core 87 made of a magnetic film, a coil 88 wound around the core 87, and a magnetic field reflux portion 81 located along a bottom or top surface of the bias magnetic field generator device 86. The magnetic field ref lux portion 81 is made of a filmy magnetic material comprising a magnetic film 83 and an insulating film 84, which are stacked on a conductive film 82. The magnetic field reflux portion 81 refluxes a magnetic field generated by the coil 88. This causes little leakage of the magnetic field generated by the coil 88, so that a bias magnetic field can be efficiently applied to a thin film magnetic sensor. For example, a magnetic head has a very small gap between a magnetic storage medium and a thin film magnetic sensor and also has a very small magnetic pattern of the magnetic storage medium, and therefore, when a magnetic field leaks out of a bias magnetic field generator device, the magnetic pattern of the magnetic storage medium may be overwritten with the leaking magnetic field. However, the above-described structure can prevent the overwriting of the magnetic pattern.

SEVENTH EXAMPLE

Figure 29:
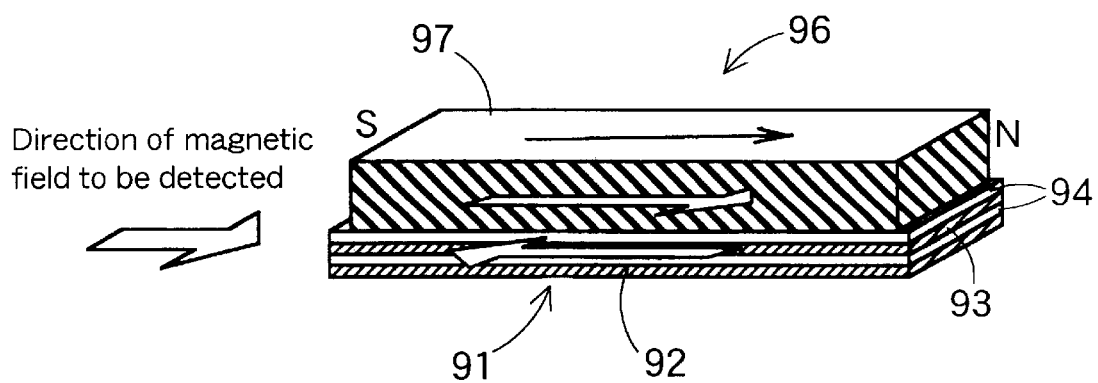
FIG. 29 is a perspective view of a bias magnetic field generator device according to a seventh example.

FIG. 29 shows a bias magnetic field generator device 96 of a magnetic sensor device of a seventh example. The bias magnetic field generator device 96 comprises a thin film permanent magnet 97, and a magnetic field reflux portion 91 located on or under the permanent magnet 97. Similarly to the above-described magnetic field ref lux portion 81, the magnetic field ref lux portion 91 is made of a filmy magnetic material comprising a magnetic film 93 and an insulating film 94, which are stacked on a conductive film 92, and the magnetic field reflux portion 91 refluxes a magnetic field generated by the permanent magnet 97. Since the bias magnetic field generator device 96 uses the permanent magnet 97, a wiring and a circuit for supplying a current are unnecessary, so that the structure can be simplified and the leakage of magnetic field can be reduced.

EIGHTH EXAMPLE

Figure 30:
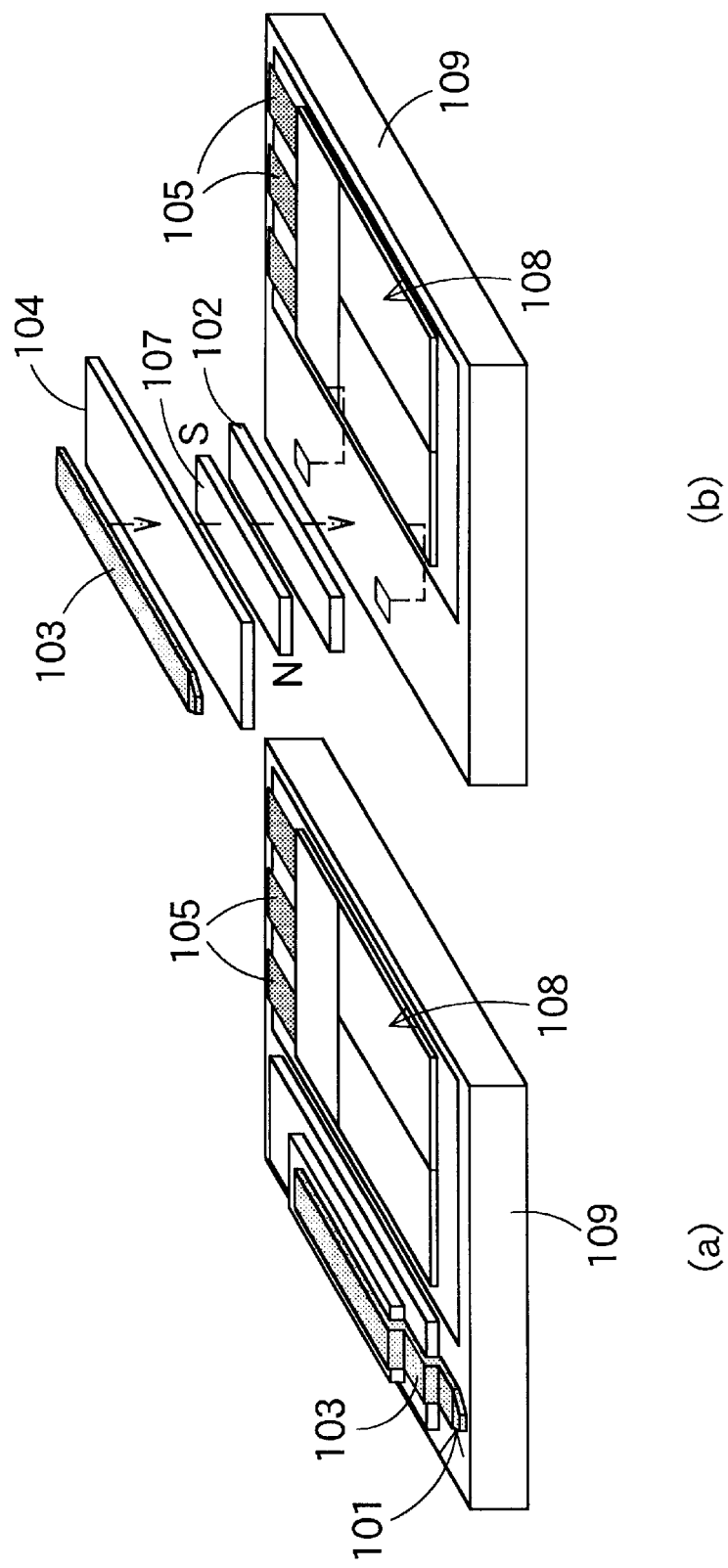
FIGS. 30A and 30B are a perspective view of a magnetic sensor device according to an eighth example and an exploded perspective view of the magnetic sensor device, respectively.

FIGS. 30A and 30B show a magnetic sensor device of an eighth example. The magnetic sensor device comprises a semiconductor substrate 109, a thin film magnetic sensor 101, a bias magnetic field generator device 106, an oscillator/detector circuit 108, and a terminal 105, which are located on the semiconductor substrate 109. The thin film magnetic sensor 101 comprises an insulating film 104 and a magnetic film 103 located on the insulating film 104, and the magnetic film 103 is tapered so as to make it possible to detect a narrower magnetic pattern. The bias magnetic field generator device 106 is located under and on the side of the magnetic film 103 with the insulating film 104 in between so as to apply a bias magnetic field to the thin film magnetic sensor 101. The oscillator/detector circuit 108 is located adjacent to the thin film magnetic sensor 101 on the semiconductor substrate 109, and the terminal 105 of the circuit 108 is formed on the edge of the semiconductor substrate 109. The oscillator/detector circuit 108 can be configured without the use of the capacitor used in the above-described example 2, and the circuit 108 can determine the oscillation conditions of the oscillator circuit without the capacitor.

Figure 31:
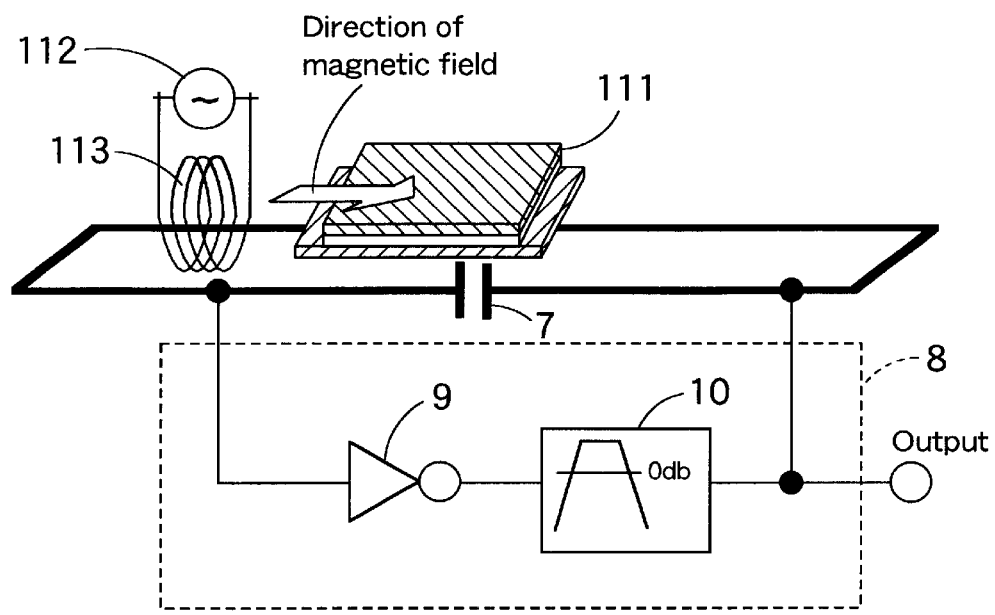
FIG. 31 is an illustration of a configuration of a frequency signal converter which converts a signal transmitted from a signal source into a frequency signal.

FIG. 31 shows a circuit which converts an electric signal transmitted from a signal source 112 into a frequency signal by using the magnetic sensor device. In this circuit, a coil 113 to which the electric signal from the signal source 112 is input is electromagnetically coupled to a circuit connected to a conductor of a magnetic sensor 111. Similarly to the device shown in FIG. 4, the capacitor 7 is connected to both sides of the conductor of the magnetic sensor 111, and the oscillator circuit 8 is connected in parallel to the capacitor 7. The oscillator circuit 8 has the amplifier 9 and the filter 10, and the FM demodulating circuit is connected to the output of the oscillator circuit 8 in order to extract a frequency change.

The signal source 112 applies the frequency-demodulated signal to the coil 113, and the coil 113 generates a magnetic field which changes according to the signal. The change in the magnetic field is output as a change in the oscillation frequency of the oscillator circuit 8, and the output signal is demodulated and extracted. A signal converter using the above-mentioned magnetic sensor 111 allows eliminating noise from feeble audio/video signals and the like containing a lot of noise in a television, a DVD (a digital versatile disc), a VCR (a video cassette recorder) or the like, thereby permitting excellent signal transmission. Since the signal converter converts a signal into a frequency independent of voltage and amplitude and outputs the converted signal through the FM demodulating circuit, the circuit can be greatly simplified and can thus improve the S/N ratio of the signal, as compared to a conventional signal processing circuit.

Figure 32:
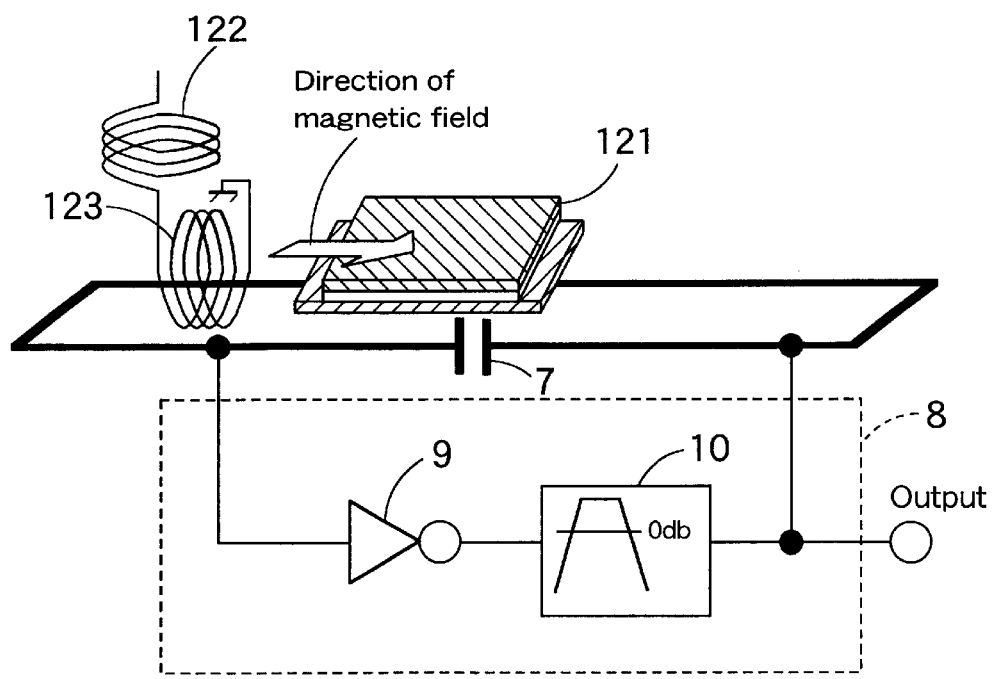
FIG. 32 is an illustration of a configuration of a frequency signal converter which converts a signal received by an antenna into a frequency signal.

FIG. 32 shows a circuit which converts an electric signal received by an antenna 122 into a frequency signal by using the magnetic sensor device. In this circuit, a coil 123 to which the signal received by the antenna 122 is input is electromagnetically coupled to the circuit. Similarly to the device shown in FIG. 5, the capacitor 7 is connected to both sides of a conductor of a magnetic sensor 121, and the oscillator circuit 8 is connected in parallel to the capacitor 7. The oscillator circuit 8 has the amplifier 9 and the filter 10, and the FM demodulating circuit is connected to the output side of the oscillator circuit 8 in order to extract a frequency change.

The signal received by the antenna 122 is applied to the coil 123, and the coil 123 generates a magnetic field which changes according to the signal. The change in the magnetic field is output as a change in the oscillation frequency of the oscillator circuit 8, and the output signal is demodulated and extracted. A signal converter using the above-mentioned magnetic sensor 121 allows directly converting a received signal into a signal of great amplitude and extracting the converted signal, and therefore allows eliminating noise from a feeble video or audio signal and the like containing a lot of noise in a television or a radio, thereby permitting excellent signal reception and reproduction. Since the signal converter directly converts a signal into a frequency independent of voltage and amplitude and outputs the converted signal, the converter can easily perform detection for selecting a received frequency by the subsequent digital data processing and can therefore extract a signal having an excellent S/N ratio without the use of a conventional tuning detector circuit.

Figure 33:
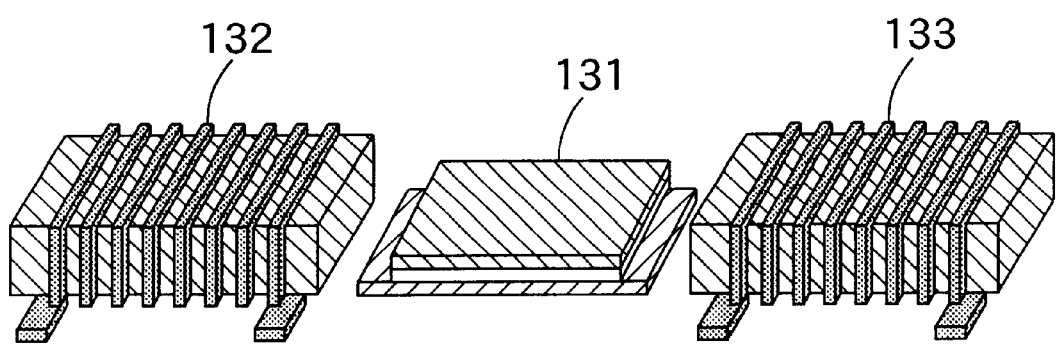
FIG. 33 is a perspective view of a thin film magnetic sensor, a magnetic field generator device, and a bias magnetic field generator device, which are formed on the same substrate.

FIG. 33 shows an example in which a thin film magnetic sensor 131 for use in the above-described frequency signal converter circuit, a bias magnetic field generator device 133 and a magnetic field generator device 132 are formed on the same substrate as a thin film device. Similarly to the above-described examples, the bias magnetic field generator device 133 comprises a core and a coil wound around the core. The core is formed by shaping a thin film made of a magnetic material such as Co into a minute rectangular thin film, and the coil wound around the core is made of a thin film conductor. Similarly, the magnetic field generator device 132 comprises a core and a coil wound around the core. The core is formed by shaping a thin film made of a magnetic material such as Co into a minute rectangular thin film, and the coil wound around the core is made of a thin film conductor. The magnetic field generator device 132 and the bias magnetic field generator device 133 are located adjacent to and facing the thin film magnetic sensor 131 on both sides of the sensor 131 so as to apply a magnetic field in the same direction to the sensor 131 from the sides opposite to the sensor 131. Although not shown in FIG. 33, the oscillator circuit shown in FIG. 11 is connected to the thin film magnetic sensor 131, and the bias current control circuit is connected to the bias magnetic field generator device 133.

As described above, the magnetic field generator device 132 and the bias magnetic field generator device 133 are formed as a thin film on the substrate on which the thin film magnetic sensor 131 is formed, whereby a very small frequency signal converter can be formed. Furthermore, similarly to the example shown in FIG. 24, the oscillator circuit, the bias circuit and the like are integrated on the same substrate, whereby the circuit can become an integrated circuit.

In the above-described examples, the description is given with regard to the examples in which the magnetic sensor is applied to the magnetic head and the signal converter, but the magnetic sensor of the present invention may be applied to a magnetic sensor device of a device for reading a magnetic pattern or a barcode recorded on a magnetic card, a magnetic rotary encoder, or a device for detecting a rotating angle or a rotating speed of a rotor.

As described above, according to the magnetic sensor device of the present invention, a magnetic field to be detected causes a change in the threshold frequency of the magnetic film of the magnetic sensor, and a change in the magnetic field to be detected is detected as a change in the oscillation frequency of oscillating means caused by the change in the threshold frequency. Therefore, the magnetic sensor device of the present invention can detect a high-density magnetic pattern with higher sensitivity and detect magnetism at far higher speed at up to higher frequencies, as compared to the conventional device. Moreover, the magnetic sensor device is not limited in shape elements such as the film thickness, the cross-sectional area of the film and the total volume of the magnetic material, and therefore a very small magnetic sensor device can be formed.

The present invention is not limited to the abovedescribed embodiments. Obviously many modifications and variations of the present invention are possible in the light of the above teachings. It is therefore to be understood that within the scope of the appended claims the present invention may be practiced otherwise than as specifically described.

What is claimed is:

1. A magnetic sensor device comprising:
   a magnetic material to which a magnetic field to be detected is applied; and
   oscillating means for oscillating in a threshold frequency range of said magnetic material,
   wherein said oscillating means oscillates in a transient threshold frequency range in which a loss component that is an imaginary part of complex magnetic permeability of said magnetic material increases and effective magnetic permeability that is a real part of the complex magnetic permeability decreases sharply, thereby detecting a change in the magnetic field to be detected as a change in an oscillation frequency in the threshold frequency range.

2. The magnetic sensor device according to claim 1, wherein the threshold frequency range of said magnetic material is near a magnetic resonance frequency of said magnetic material.

3. A magnetic sensor device comprising:
   a magnetic material; and
   an oscillator circuit which sets an oscillation frequency to a frequency near a threshold frequency of said magnetic material and oscillates at the set oscillation frequency,
   wherein said oscillator circuit detects a change in the threshold frequency of said magnetic material caused by a change in a magnetic field to be detected as a change in the oscillation frequency of said oscillator circuit, and outputs the change in the magnetic field to be detected as the change in the oscillation frequency.

4. The magnetic sensor device according to claim 3, wherein said magnetic material is included in a magnetic sensor, the magnetic sensor has a conductor which lets a current of said oscillator circuit pass through, as well as said magnetic material, and said magnetic material has much higher volume resistivity than the conductor has.

5. The magnetic sensor device according to claim 3, wherein said magnetic material is included in a magnetic sensor, and the magnetic sensor has said magnetic material, an electrical insulating layer, and a conductor which is located with the electrical insulating layer in between the conductor and said magnetic material, is affected by the threshold frequency of said magnetic material and lets a current of said oscillator circuit pass through.

6. The magnetic sensor device according to claim 5, wherein at least said magnetic material of the magnetic sensor is formed as a thin film magnetic film by use of thin film process.

7. The magnetic sensor device according to claim 6, wherein the magnetic film is formed of a multilayer film comprising a magnetic layer and a nonmagnetic layer, which are stacked.

8. The magnetic sensor device according to claim 5, wherein said oscillator circuit is formed on a semiconductor substrate on which the magnetic sensor is formed.

9. The magnetic sensor device according to claim 8, wherein a bias magnetic field generator for applying a bias magnetic field to the magnetic sensor is provided near the magnetic sensor.

10. The magnetic sensor device according to claim 1, wherein the magnetic field to be detected is a magnetic storage pattern stored through magnetization.

11. The magnetic sensor device according to claim 1, wherein the magnetic field to be detected is a magnetic field generated by an electric signal generated by a coil.

12. A magnetic sensor device comprising:
    a thin film magnetic sensor including a conductive layer and a thin film magnetic film; and
    an oscillator circuit connected to the conductive layer of said thin film magnetic sensor, said oscillator circuit which sets an oscillation frequency to a frequency near a magnetic resonance frequency of the magnetic film and oscillates at the set oscillation frequency,
    wherein said oscillator circuit detects a change in the magnetic resonance frequency of the magnetic film caused by a change in a magnetic field to be detected as a change in the oscillation frequency of said oscillator circuit, and outputs the change in the magnetic field to be detected as the change in the oscillation frequency.

* * * * *